(12) United States Patent
Sakamaki

(10) Patent No.: US 12,396,303 B2
(45) Date of Patent: Aug. 19, 2025

(54) LIGHT-EMITTING DEVICE AND METHOD FOR MANUFACTURING THE SAME

(71) Applicant: NICHIA CORPORATION, Anan (JP)

(72) Inventor: So Sakamaki, Anan (JP)

(73) Assignee: NICHIA CORPORATION, Anan (JP)

( * ) Notice: Subject to any disclaimer, the term of this patent is extended or adjusted under 35 U.S.C. 154(b) by 478 days.

(21) Appl. No.: 18/069,201

(22) Filed: Dec. 20, 2022

(65) Prior Publication Data

US 2023/0197915 A1    Jun. 22, 2023

(30) Foreign Application Priority Data

Dec. 22, 2021 (JP) ................................. 2021-208354
Feb. 7, 2022 (JP) ................................. 2022-017177

(51) Int. Cl.
| | | |
|---|---|---|
| *H01L 33/60* | (2010.01) | |
| *H10H 20/01* | (2025.01) | |
| *H10H 20/851* | (2025.01) | |
| *H10H 20/856* | (2025.01) | |

(52) U.S. Cl.
CPC .......... *H10H 20/856* (2025.01); *H10H 20/01* (2025.01); *H10H 20/8513* (2025.01)

(58) Field of Classification Search
CPC .. H10H 20/856; H10H 20/01; H10H 20/8513; H10H 20/034; H10H 20/0361; H10H 20/82; H10H 20/8512; H10H 20/855; H10H 20/857; H10H 20/84; H01L 25/0753
See application file for complete search history.

(56) References Cited

U.S. PATENT DOCUMENTS

| | | |
|---|---|---|
| 2017/0250325 A1 | 8/2017 | Tosuke |
| 2017/0331003 A1 | 11/2017 | Cheng et al. |
| 2020/0411738 A1* | 12/2020 | Kim ..................... H10H 20/857 |
| 2021/0043617 A1 | 2/2021 | Onuma et al. |
| 2021/0135064 A1 | 5/2021 | Ishio |

(Continued)

FOREIGN PATENT DOCUMENTS

| | | |
|---|---|---|
| JP | 2007273498 A | 10/2007 |
| JP | 2014216588 A | 11/2014 |

(Continued)

*Primary Examiner* — Mohammed R Alam
(74) *Attorney, Agent, or Firm* — Hunton Andrews Kurth LLP

(57) ABSTRACT

A method for manufacturing a light-emitting device including a light-emitting element and a quantum dot configured to convert light emitted by the light-emitting element includes: preparing a base and a light-emitting element disposed on the base; forming a light reflective member surrounding the light-emitting element and including an inner surface and a top surface; forming a first barrier layer continuously covering a surface of the light-emitting element and the inner surface and the top surface of the light reflective member; forming a wavelength conversion member including the quantum dot in a region surrounded by the inner surface of the light reflective member, the light-emitting element being embedded in the wavelength conversion member; and covering, with a second barrier layer, a top surface of the wavelength conversion member and at least a portion of the first barrier layer on the top surface of the light reflective member.

19 Claims, 19 Drawing Sheets

(56) References Cited

U.S. PATENT DOCUMENTS

2021/0151422 A1    5/2021   Iguchi et al.
2021/0343410 A1   11/2021   Zhang et al.

FOREIGN PATENT DOCUMENTS

| | | |
|---|---|---|
| JP | 2015220330 A | 12/2015 |
| JP | 2017139464 A | 8/2017 |
| JP | 2017157822 A | 9/2017 |
| JP | 2018132662 A | 8/2018 |
| JP | 2020181980 A | 11/2020 |
| JP | 2021071645 A | 5/2021 |
| JP | 2021082687 A | 5/2021 |
| JP | 2021131527 A | 9/2021 |

* cited by examiner

LIGHT-EMITTING DEVICE AND METHOD FOR MANUFACTURING THE SAME

CROSS-REFERENCE TO RELATED APPLICATION

This application claims priority to Japanese Patent Application No. 2022-017177, filed on Feb. 7, 2022, and Japanese Patent Application No. 2021-208354, filed on Dec. 22, 2021, the contents of which are incorporated by references in their entireties.

BACKGROUND

The present disclosure relates to a light-emitting device and a method for manufacturing the light-emitting device.

A known light-emitting device that emits white light includes a light-emitting element that emits blue light, a green phosphor that emits green light (or a yellow green phosphor that emits yellow green light) when absorbing a part of the blue light emitted by the light-emitting element, and a red phosphor that emits red light when absorbing a part of the blue light emitted by the light-emitting element.

In a recently developed light-emitting device, all or some of phosphors are replaced by quantum dots (QDs) (see, for example, JP2007-273498A).

Quantum dots have a problem of degradation due to exposure to oxygen and moisture over time and a resulting decrease in wavelength conversion performance. An object of the present disclosure is to provide a light-emitting device that suppresses the degradation of quantum dots, and a method for manufacturing the light-emitting device.

SUMMARY

A method for manufacturing a light-emitting device according to an embodiment of the present disclosure is a method for manufacturing a light-emitting device including a light-emitting element and a quantum dot configured to convert light emitted by the light-emitting element, the method including: preparing a base and a light-emitting element disposed on the base; forming a light reflective member surrounding the light-emitting element and including an inner surface and a top surface; forming a first barrier layer continuously covering a surface of the light-emitting element and the inner surface of the light reflective member and the top surface of the light reflective member; forming a wavelength conversion member including the quantum dot in a region surrounded by the inner surface of the light reflective member, the light-emitting element being embedded in the wavelength conversion member; and covering, with a second barrier layer, a top surface of the wavelength conversion member and at least a portion of the first barrier layer on the top surface of the light reflective member.

In addition, a light-emitting device according to another embodiment of the present disclosure includes: a base; a light-emitting element disposed on the base; a light reflective member surrounding the light-emitting element and including an inner surface and a top surface; a first barrier layer continuously covering a surface of the light-emitting element and the inner surface of the light reflective member and the top surface of the light reflective member; a wavelength conversion member including a quantum dot and disposed in a region surrounded by the inner surface of the light reflective member; and a second barrier layer covering a top surface of the wavelength conversion member and at least a portion of the first barrier layer on the top surface of the light reflective member.

According to an embodiment of the present disclosure, it is possible to provide a light-emitting device that suppresses the degradation of quantum dots, and a method for manufacturing the light-emitting device.

DESCRIPTION OF EMBODIMENTS

Figure 1:
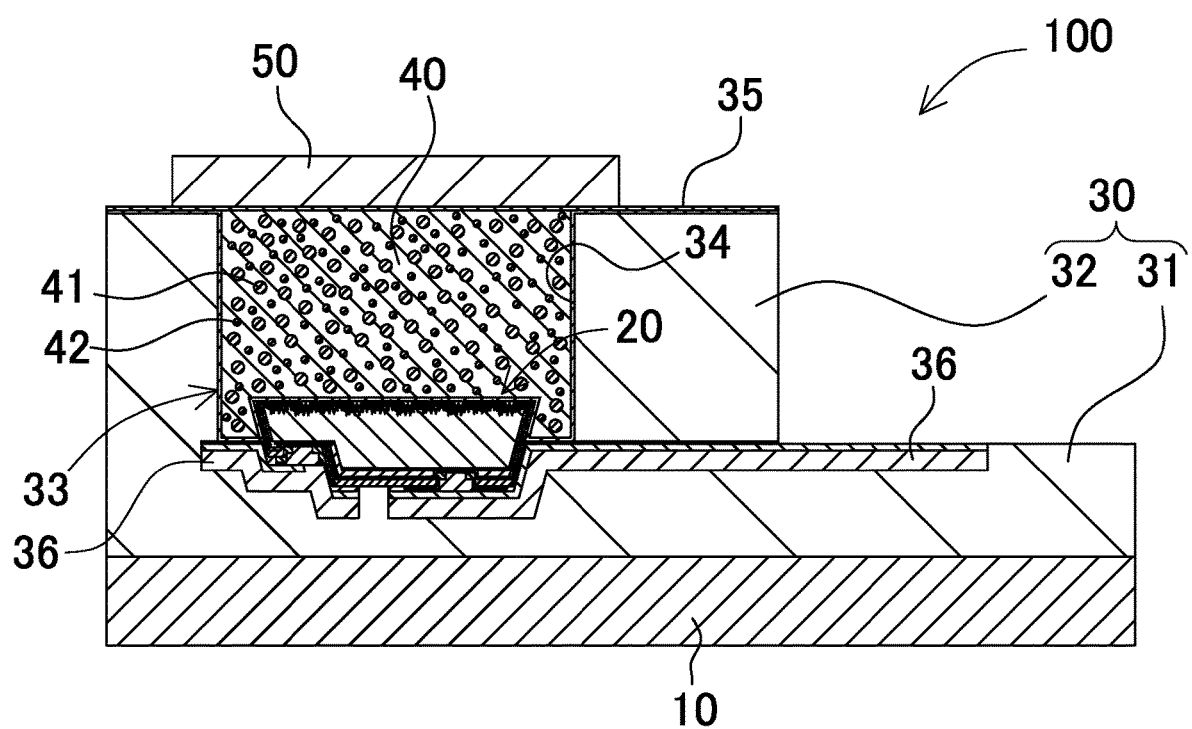
FIG. 1 is a cross-sectional view of an exemplary light-emitting device according to an embodiment of the present disclosure.

The present invention is described below with reference to the accompanying drawings. Note that in the following description, the terms indicating specific directions and positions (such as "upper", "lower", and other terms including the terms) are used as necessary, but such terms are used for the purpose of facilitating the understanding of the invention with reference to the accompanying drawings, and the technical scope of the present invention is not limited by the meaning of the terms. In addition, the portions denoted with the same symbol in multiple drawings are the same or equivalent portions or members.

Further, the embodiments described below are specific examples of the technical idea of the present invention, and the present invention is not limited to the following description. In addition, the dimensions, materials, shapes, relative positions and the like of the components described below are intended for exemplification, not for limiting the scope of the present invention unless otherwise specified. In addition, the content described in one embodiment or example is applicable to other embodiments and examples. In addition, the size, positional relationships and the like of the members illustrated in the drawings may be exaggerated for clarity of explanation.

EMBODIMENTS

FIG. 1 is a cross-sectional view illustrating an exemplary light-emitting device according to an exemplary embodiment of the present disclosure. A light-emitting device 100 illustrated in this drawing includes a base 10, a light-emitting element 20 disposed on the base 10, a light reflective member 30 that surrounds light-emitting element 20, and a wavelength conversion member 40.

Base 10

The base 10 comprises a support substrate for placing the light-emitting element 20, the light reflective member 30 and the like on the top surface. A rigid substrate represented by a ceramic substrate, a SiC substrate and the like, a flexible substrate represented by a print wiring substrate, and the like may be used for the base 10. It is preferable to use a print wiring substrate because it enables production of a flexible light-emitting device.

Light-Emitting Element 20

The light-emitting element 20 is placed on the base 10. In the example illustrated in FIG. 1, the light-emitting element 20 is disposed on the top surface of the light reflective member 30 provided on the base 10. While one light-emitting element 20 is provided in this example, a plurality of light-emitting elements may be disposed.

A light-emitting element such as an LED and an LD may be suitably used for the light-emitting element 20. For the LED, a semiconductor laminate including a light emission member (hereinafter also referred to simply as "semiconductor laminate") may be used. The semiconductor laminate has light emission properties, and, for such a semiconductor laminate, a laminate obtained by stacking a plurality of semiconductor layers of ZnS, SiC, GaN, GaP, InN, AlN, ZnSe, GaAsP, GaAlAs, InGaN, GaAlN, AlInGaP, AlInGaN and the like on the base by liquid phase deposition, a HVPE method or a MOCVD method, and forming a light-emitting layer in any of the semiconductor layers is used. By selecting the material of the semiconductor layer and its mixing rate, various light-emission wavelengths of the light emission member can be selected in a range from ultraviolet light to infrared light. In particular, a display device that can be suitably used in the open air requires a semiconductor laminate that can emit high luminance light. In view of this, it is preferable to select a nitride semiconductor for the material of the green and blue light emission members that emit high luminance light. For example, as the material of the light emission member, $In_xAl_yGa_{1-X-Y}N$ ($0 \leq X \leq 1$, $0 \leq Y \leq 1$, $X+Y \leq 1$) and the like may be used. The light-emitting element 20 may have a size in a range from 1 μm to 2000 μm, preferably, from 1 μm to 50 μm.

Light Reflective Member 30

The light reflective member 30 is a member for reflecting light emitted by the light-emitting element 20. Such a light reflective member 30 surrounds the light-emitting element 20. By providing the light reflective member 30 around the light-emitting element 20, leakage of the light of the light-emitting element 20 in unintended directions is suppressed. The light reflective member 30 can comprise or be composed of resin containing the light reflective material such as $TiO_2$ and the like.

The light reflective member 30 includes an inner surface and a top surface. In the example illustrated in FIG. 1, the region surrounded by the inner surface of the light reflective member 30 is defined as a recess 33. A metal layer 36 is formed in the bottom surface of the recess 33, and the light-emitting element 20 is disposed on the metal layer 36. The light reflective member 30 comprises a flat primary member 31 provided on the top surface of the base 10, and a side wall member 32 provided on the primary member 31. The region surrounded by the side wall member 32 on the primary member 31 is the recess 33. Note that the primary member 31 and the side wall member 32 may be provided as separate members, or may be integrally formed. In the case in which they are provided as separate members, the side wall member 32 may be formed of a white dry film or the like (details are described later).

The metal layer 36 is connected with an electrode formed in the light-emitting element 20 through solder and the like. In addition, the metal layer 36 is connected with an external electrode, and the driving power is supplied to the light-emitting element 20 from the external electrode through the metal layer 36. Cu, Au and the like can be used for such a metal layer 36.

Wavelength Conversion Member 40

The wavelength conversion member 40 receives light emitted by the light-emitting element 20 and converts the wavelength of the light into different wavelengths. The wavelength conversion member 40 includes a wavelength conversion material such as quantum dots (QD) and phosphors. The quantum dots convert the light into different wavelengths in accordance with their particle sizes. For such quantum dots, quantum dots with an average particle diameter of 10 nm or less, preferably an average particle diameter in a range from 4 nm to 10 nm, are used. In addition, multiple types of quantum dots with different particle sizes may be mixed. In the example illustrated in FIG. 2, two types of quantum dots, a first quantum dot 41 and a second quantum dot 42, are mixed. Here, a red quantum dot with an average particle diameter of 9 nm that receives blue light of the light-emitting element and converts the received blue light into red light is used as the first quantum dot 41, and a green quantum dot with an average particle diameter of 5 nm that receives blue light of the light-emitting element and converts the received blue light into green light is used as the second quantum dot 42. The average particle diameter can be measured by using the scanning transmission electron microscopy HD-2000 available from Hitachi High-Tech Corporation, and the like.

Specific examples of the quantum dots include CdSe and InP, which are phosphors with a perovskite structure, or semiconductor nano particles with a chalcopyrite structure. Note that AgInSe$_2$ is classified as a semiconductor nano particle with a chalcopyrite structure. The phosphors with a perovskite structure are expressed by the following expression.

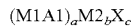

In the above expression, A1 represents one or more organic cations selected from the group consisting of ammonium, formamidinium, guanidium, imidazolium, pyridinium, pyrrolidinium and protonated thiourea, M1 represents one or more alkali metal cations selected from the group consisting of Cs, Rb, K, Na and Li, M2 represents one or more metal cations selected from the group consisting of Ge, Sn, Pb, Sb, Te and Bi, X represents one or more anions selected from the group consisting of chloride ion, bromide ion, iodide ion, cyanide ion, thiocyanate ion, isothiocyanate ion and sulfide ion, a represents 1 to 4, b represents 1 to 2, and c represents 3 to 9.

In addition, the semiconductor nano particles that have a chalcopyrite structure and emit green light are expressed by the following expression, for example.

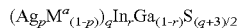

Here, p, q and r meet $0<p\le 1$, $0.20<q\le 1.2$, and $0<r<1$. $M^a$ represents alkali metal.

The semiconductor nano particles (first semiconductor) expressed by the above-described expression may have a second semiconductor including Ga and S disposed on the surface. When irradiated with light of a wavelength of 365 nm, the semiconductor nano particle exhibits band edge emission with a light emission peak wavelength in a wavelength range from 475 nm to 560 nm. The ratio (In/(In+Ga)) of the number of In atoms with respect to the total number of In and Ga atoms in the first semiconductor is, for example, in a range of equal to or greater than 0.01 and smaller than 1, preferably in a range from 0.1 to 0.99. In addition, the ratio (Ag/(In+Ga)) of the number of Ag atoms with respect to the total number of In and Ga atoms is, for example, in a range from 0.3 to 1.2, preferably in a range from 0.5 to 1.1. The ratio (S/(Ag+In+Ga)) of the number of S atoms with respect to the total number of Ag, In and Ga atoms is, for example, in a range from 0.8 to 1.5, preferably in a range from 0.9 to 1.2. The half width in the light emission spectrum of the semiconductor nano particle is, for example, 45 nm or less, preferably 40 nm or less or 35 nm or less. Preferably, the lower limit of the half width is, for example, 15 nm or greater. In addition, preferably, the lifetime of the light emission of the main component (band edge emission) is 200 ns or less.

Further, the semiconductor nano particles with a chalcopyrite structure that emit red light are expressed by the following expression, for example.

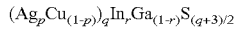

Here, p, q and r meet $0<p<1$, $0.20<q\le 1.2$, and $0<r<1$.

The semiconductor nano particles (first semiconductor) expressed by the above-described expression may have a second semiconductor including Ga and S disposed on the surface. When irradiated with light of a wavelength of 365 nm, the semiconductor nano particle exhibits band edge emission having a light emission peak wavelength in a wavelength range from 600 nm to 680 nm. The ratio (Cu/(Cu+Ag)) of the number of Cu moles with respect to the total number of Cu and Ag moles in the composition of the first semiconductor is in a range of equal to or greater than 0.01 and smaller than 1.0, preferably in a range from 0.03 to 0.99, more preferably in a range from 0.05 to 0.5. In addition, for example, the ratio ((Cu+Ag)/(Cu+Ag+In+Ga)) of the total number of Cu and Ag moles with respect to the total number of Cu, Ag, In and Ga moles in the composition of the first semiconductor is in a range of equal to or greater than 0.1 and smaller than 1.0, preferably in a range from 0.2 to 0.99. The ratio (In/(In+Ga)) of the number of In atoms with respect to the total number of In and Ga atoms in the first semiconductor is, for example, in a range of equal to or greater than 0.01 and smaller than 1, preferably in a range from 0.1 to 0.99. In addition, the ratio (Ag/(In+Ga)) of the number of Ag atoms with respect to the total number of In and Ga atoms is, for example, in a range from 0.1 to 1.2, preferably in a range from 0.2 to 1.1. In addition, the ratio ((Ag+Cu)/(In+Ga)) of the total number of Ag and Cu atoms with respect to the total number of In and Ga atoms is, for example, in a range from 0.1 to 1.2, preferably in a range from 0.2 to 1.0. The ratio (S/(Ag+In+Ga)) of the number of S atoms with respect to the total number of Ag, In and Ga atoms is, for example, in a range from 0.8 to 1.5, preferably in a range from 0.9 to 1.2. The ratio (S/(Ag+Cu+In+Ga)) of the number of S atoms with respect to the total number of Ag, Cu, In and Ga atoms is, for example, in a range from 0.8 to 1.5, preferably in a range from 0.9 to 1.2. In addition, the half width in the light emission spectrum of the semiconductor nano particle is, for example, 70 nm or less, preferably 65 nm or less or 60 nm or less. Preferably, the lower limit of the half width is, for example, 15 nm or greater. In addition, preferably, the lifetime of the light emission of the main component (band edge emission) is 200 ns or less.

The wavelength conversion member 40 is disposed at least on the light-emitting element 20 in a region surrounded by the inner surface of the light reflective member 30. In the example illustrated in FIG. 1, the light-emitting element 20 is embedded by filling the wavelength conversion member 40 in the recess 33 of the light reflective member 30. In addition, preferably, the top surface of the wavelength conversion member 40 and the top surface of the light reflective member 30 are formed on substantially the same plane. In this manner, in providing a color filter 50 on the top surface of the wavelength conversion member 40, the film thickness can be maintained at a constant thickness, and the advantage of uniform filter effect can be achieved. In addition, since the second barrier layer described later can be provided in a flat manner, the gas barrier property is improved.

First Barrier Layer 34

Further, the light-emitting device 100 includes a first barrier layer 34 and a second barrier layer 35 that cover a part or all of the surface of the light-emitting device 100. The first barrier layer 34 comprises a member with a gas barrier property. In addition, a moisture barrier property may be provided. The first barrier layer 34 continuously covers the surface of the light-emitting element 20 and the inner surface and top surface of the light reflective member 30. In this manner, the first barrier layer 34 suppresses degradation of the quantum dots included in the wavelength conversion member 40 due to entry of the oxygen and moisture included in the outside air into the wavelength conversion member 40 through the light reflective member 30. Preferably, the oxygen permeability of the first barrier layer 34 is $1 \times 10^{-2}$ g/m²/day or less. The oxygen permeability can be measured by a differential pressure method (JIS K 7126-1). For such a first barrier layer 34, $AlN_a$, $AlO_b$, $SiO_c$, $SiN_d$ ($1/3 \leq a \leq 1$, $0.5 \leq b \leq 1.5$, $0.5 \leq c \leq 2$, $1/3 < d \leq 4/3$) and the like, and combinations thereof can be used. In addition, preferably, the average film thickness of the first barrier layer 34 is in a range from 100 nm to 200 nm, but this is not limitative. The average film thickness can be measured by using Dektak XTL Stylus Profiler System available from BRUKER Corporation, and the like.

Second Barrier Layer 35

The second barrier layer 35 continuously covers the top surface of the wavelength conversion member 40, and at least a portion of the first barrier layer 34 on the top surface of the light reflective member 30. The second barrier layer 35 may also comprise or be composed of a member with a gas barrier property, and, for example, $AlN_a$, $AlO_b$, $SiO_c$, $SiN_d$ ($1/3 \leq a \leq 1$, $0.5 \leq b \leq 1.5$, $0.5 \leq c \leq 2$, $1/3 < d \leq 4/3$) and the like, and combinations thereof, can be used. In addition, the average film thickness of the second barrier layer 35 is in a range from 100 nm to 200 nm, but this is not limitative. Preferably, the first barrier layer 34 and the second barrier layer 35 comprise or are composed of the same material. In addition, preferably, the thickness of the first barrier layer 34 is the same as the thickness of the second barrier layer 35, or the first barrier layer 34 is thicker than the second barrier layer 35. In this manner, the first barrier layer 34 is more easily provided on the inner surface of the light reflective member 30, and the effect of suppressing the degradation of the wavelength conversion member 40 is achieved. Note that the first barrier layer 34 and the second barrier layer 35 may have a multi-layer structure. With a multi-layer structure, local degradation of the gas barrier property due to pin holes, foreign matters and the like generated during the formation of the gas barrier film can be avoided.

Figure 2:
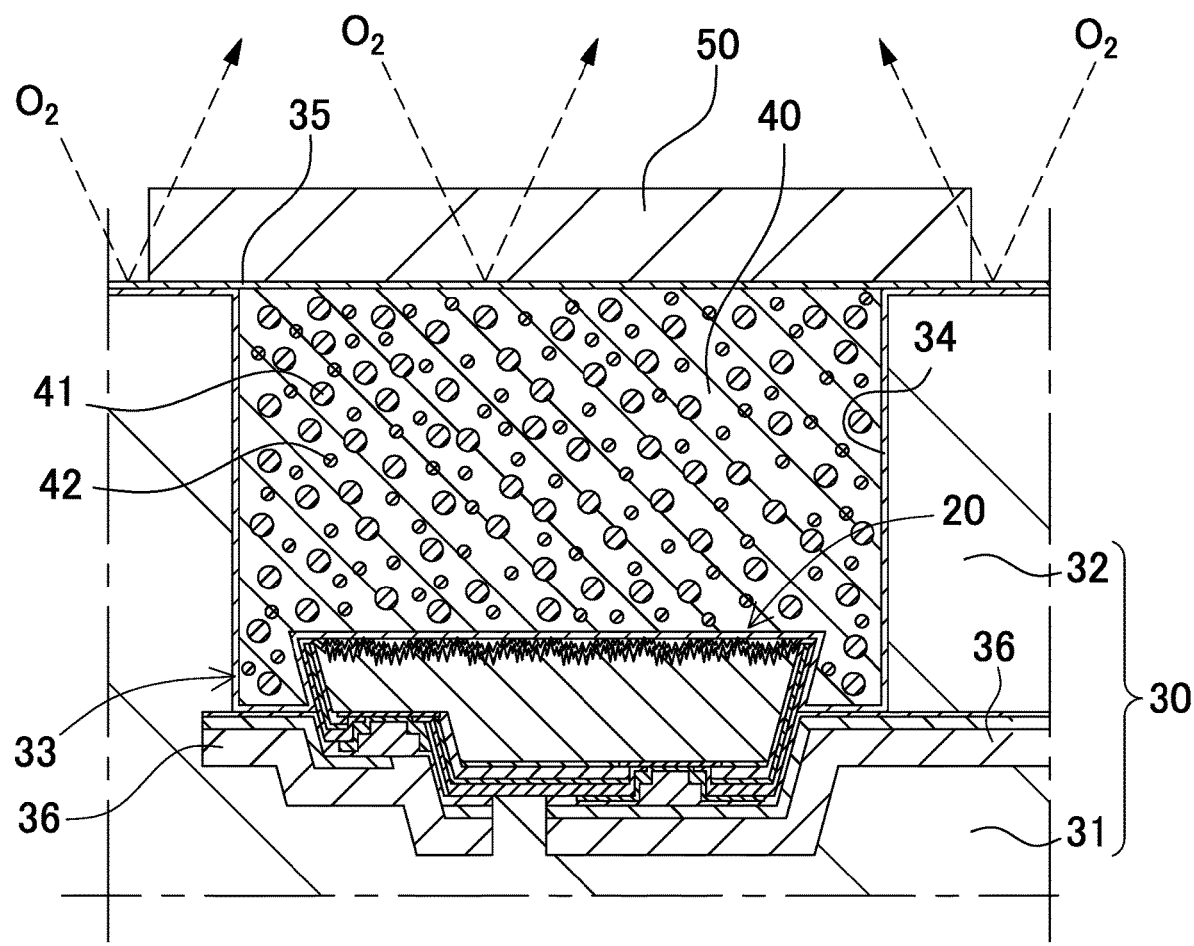
FIG. 2 is an enlarged cross-sectional view of the light-emitting device of FIG. 1.

As illustrated in the enlarged cross-sectional view of FIG. 2, the gas barrier property for the quantum dots can be increased by covering the wavelength conversion member 40 including the quantum dots with the first barrier layer 34 and the second barrier layer 35, and covering the top surface of the light reflective member 30 located around the recess 33 with the first barrier layer 34 and the second barrier layer 35 in an overlapping manner. In this manner, it is possible to improve the reliability of the quantum dots, which are easily degraded by outside air and moisture.

Color Filter 50

The color filter 50 may be provided on the second barrier layer 35. The color filter 50 is a member for absorbing the light emitted from the light-emitting element 20 but has not been absorbed by the wavelength conversion member 40. For such a color filter 50, a pigment color resist and the like can be used.

Method for Manufacturing Light-Emitting Device

A method for manufacturing the above-described light-emitting device is described with reference to FIGS. 3 to 9. The following describes a method of manufacturing a light-emitting device that emits white light through color mixture by combining the light-emitting element 20 that emits blue light and the wavelength conversion member 40 including quantum dots that receive the blue light of the light-emitting element 20 and emit red light and green light.

Figure 3:
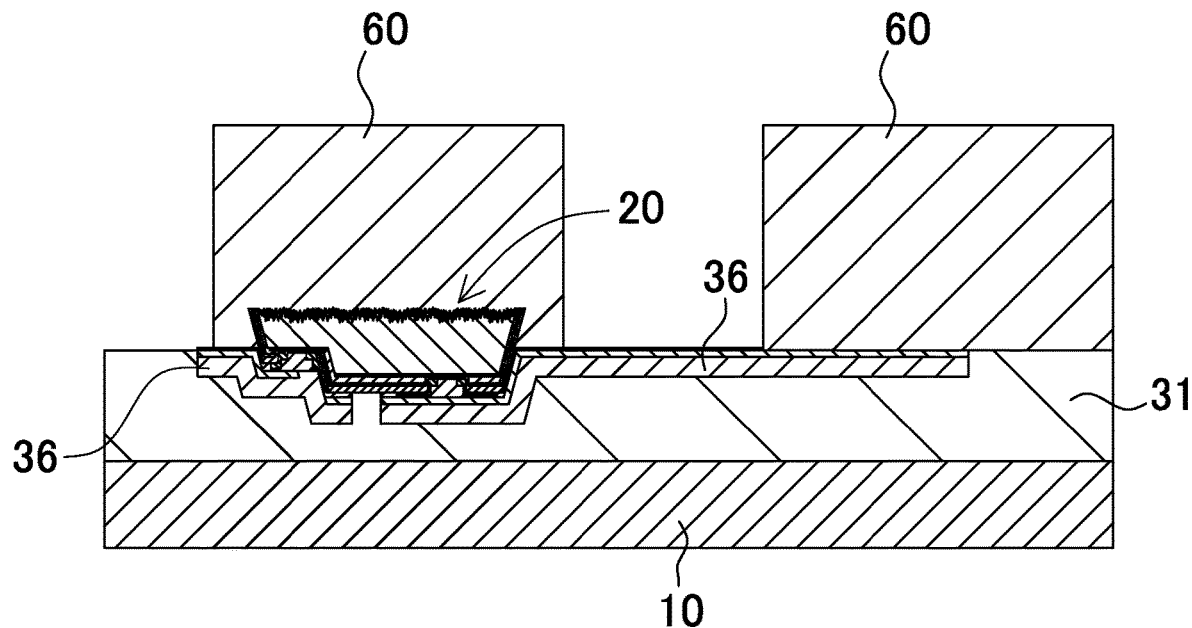
FIG. 3 is a cross-sectional view illustrating an exemplary manufacturing process of the light-emitting device according to the embodiment of the present disclosure.
Figure 4:
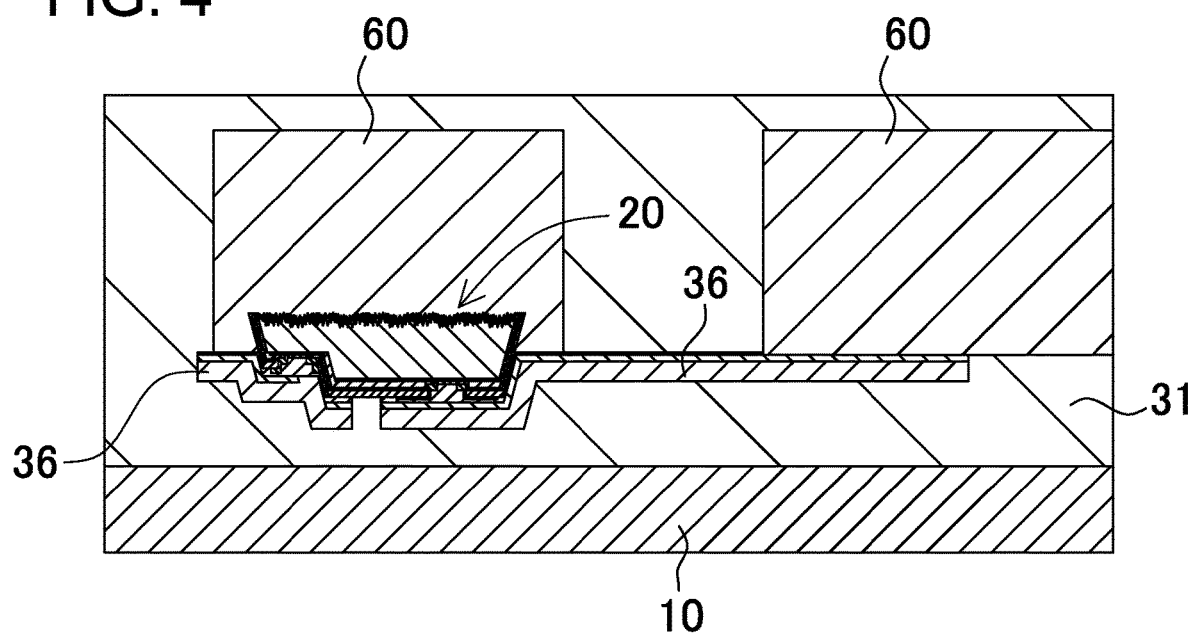
FIG. 4 is a cross-sectional view illustrating an exemplary manufacturing process of the light-emitting device according to the embodiment of the present disclosure.
Figure 5:
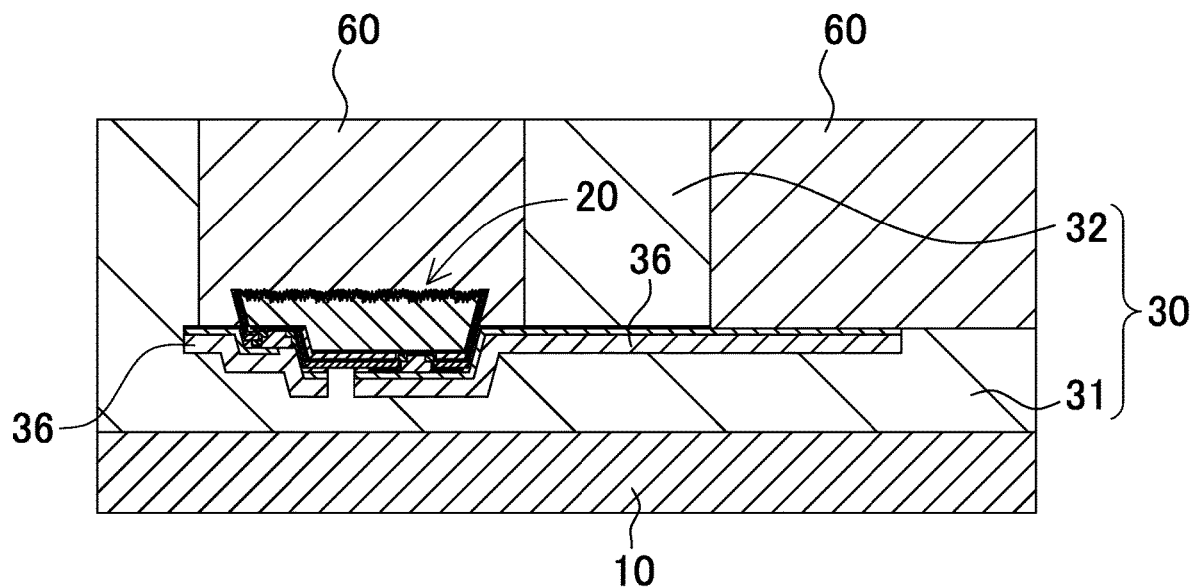
FIG. 5 is a cross-sectional view illustrating an exemplary manufacturing process of the light-emitting device according to the embodiment of the present disclosure.
Figure 6:
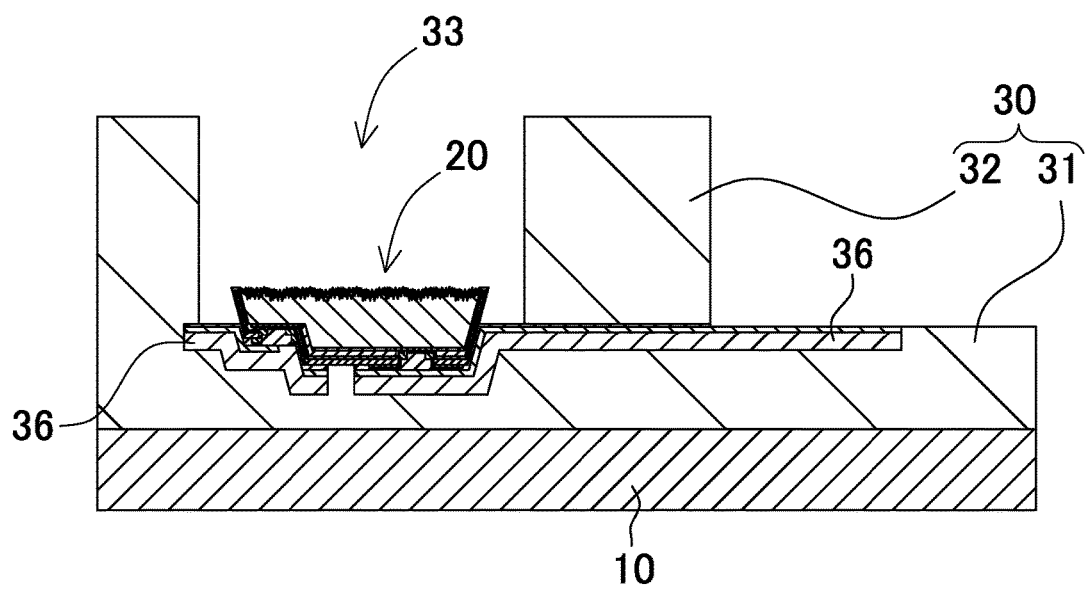
FIG. 6 is a cross-sectional view illustrating an exemplary manufacturing process of the light-emitting device according to the embodiment of the present disclosure.

First, the base 10 and the light-emitting element 20 disposed on the base 10 are prepared, and the light reflective member 30 is formed to surround this light-emitting element 20. For example, a print wiring substrate with a thickness of 100 μm is prepared as the base 10, and on the top surface of the base 10, silicone resin in which $TiO_2$ particles are mixed is applied and cured as the primary member 31 of the light reflective member 30. Further, the metal layer 36 is formed by Cu plating on a part of the primary member 31, and a blue LED is mounted on this metal layer 36 as the light-emitting element 20. In this state, as illustrated in FIG. 3, the region where the side wall member 32 is not formed is protected with a resist 60 on the top surface of the primary member 31. An acrylic-resin based photoresist and the like can be used for the resist 60. Then, as illustrated in FIG. 4, resin for forming the side wall member 32 of the light reflective member 30 is applied from above the resist 60. Here, as with the primary member 31, silicone resin in which $TiO_2$ particles are mixed is applied and cured. Thereafter, as illustrated in FIG. 5, the surface of the silicone resin is cut to expose the resist 60. Further, as illustrated in FIG. 6, the side wall member 32 is formed by removing the resist 60 through reactive ion etching (RIE).

Figure 7:
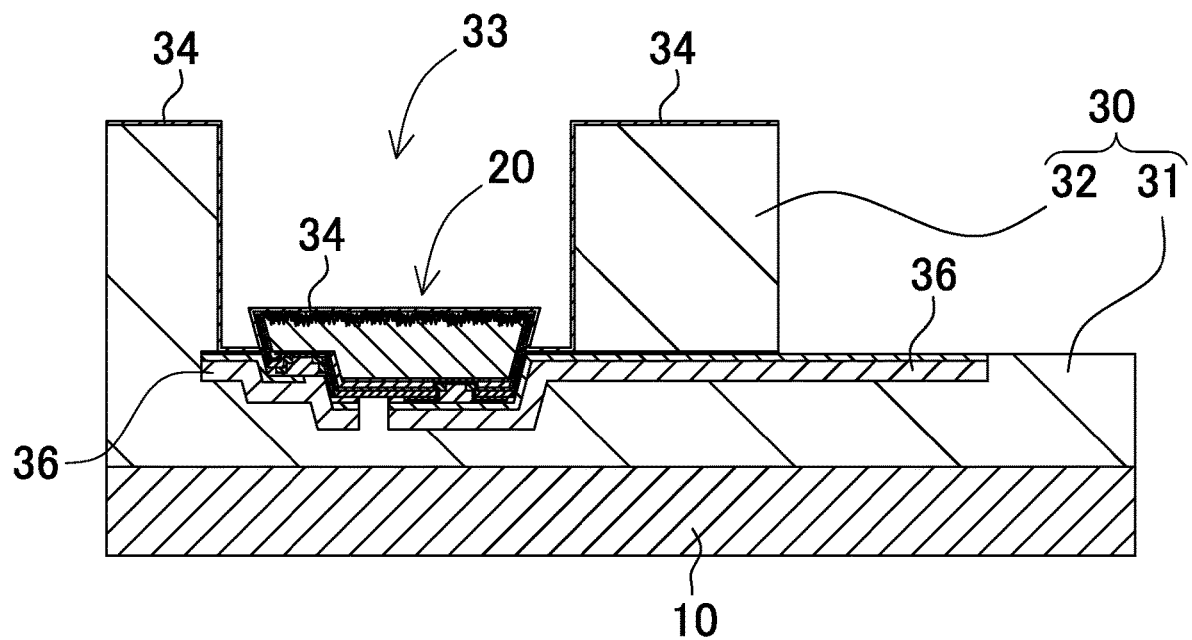
FIG. 7 is a cross-sectional view illustrating an exemplary manufacturing process of the light-emitting device according to the embodiment of the present disclosure.

Subsequently, as illustrated in FIG. 7, the first barrier layer 34 is formed to continuously cover the top surface and inner surface of the light reflective member 30 and the surface of the light-emitting element 20. Here, a layer comprising or composed of $Al_2O_3$, $SiO_2$, SiN or the like, or a combination thereof is formed through sputtering such that the layer has an average film thickness of 150 nm. Through the sputtering, the film thickness of the formed first barrier layer 34 can be accurately controlled.

Figure 8:
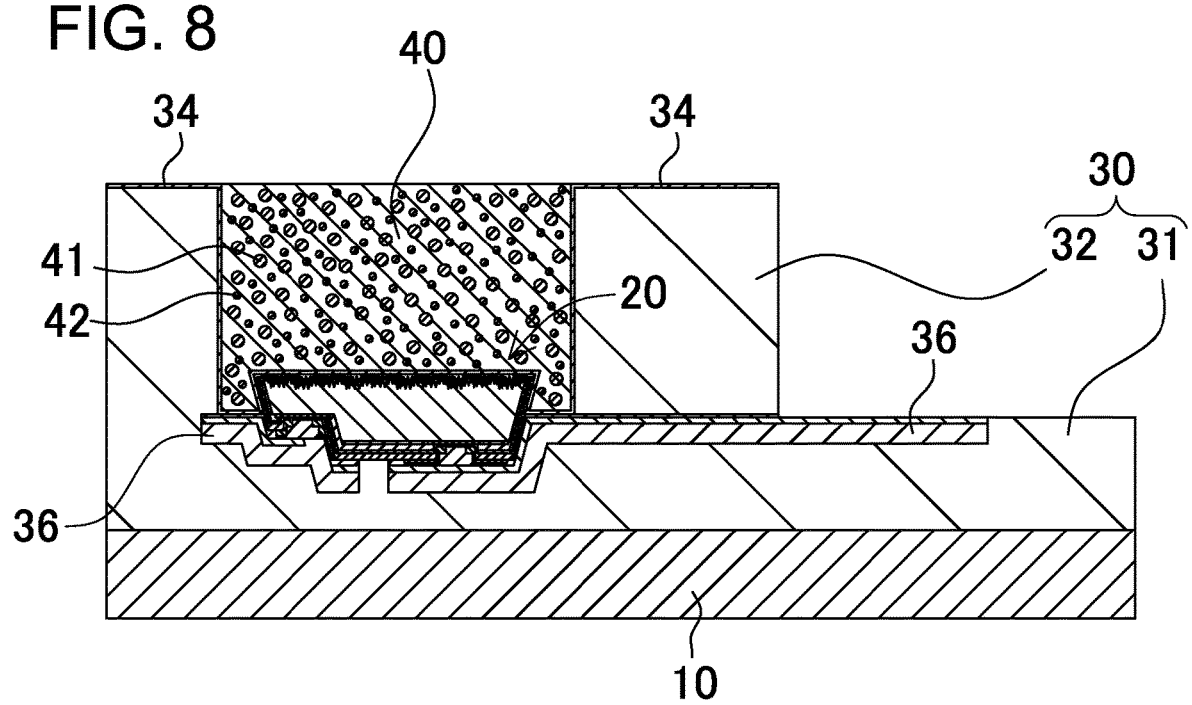
FIG. 8 is a cross-sectional view illustrating an exemplary manufacturing process of the light-emitting device according to the embodiment of the present disclosure.

Further, after covering with the first barrier layer 34, the wavelength conversion member 40 is formed in the recess 33. Here, as illustrated in FIG. 8, a wavelength conversion member including green quantum dots with an average particle diameter of 5 nm that perform the wavelength conversion of the blue light of the light-emitting element 20 into green light, and red quantum dots with an average particle diameter of 9 nm that perform the wavelength conversion of the blue light into red light is filled into the recess 33 through photolithography, and cured. This provides the advantage of forming the wavelength conversion member including the quantum dots in precise patterns and film thicknesses. Note that the method of forming the wavelength conversion member is not limited to photolithography, and, for example, an ink-jet method of jetting and applying a wavelength conversion member material including quantum dots from an ink-jet nozzle, and the like may also be used. In this manner, an appropriate amount of the wavelength conversion member can be filled into the recess 33, and the advantage of efficiently filling the wavelength conversion member to the appropriate location while avoiding the waste of the material can be achieved. In this manner, the ink-jet system is advantageous in terms of cost and efficiency.

Figure 9:
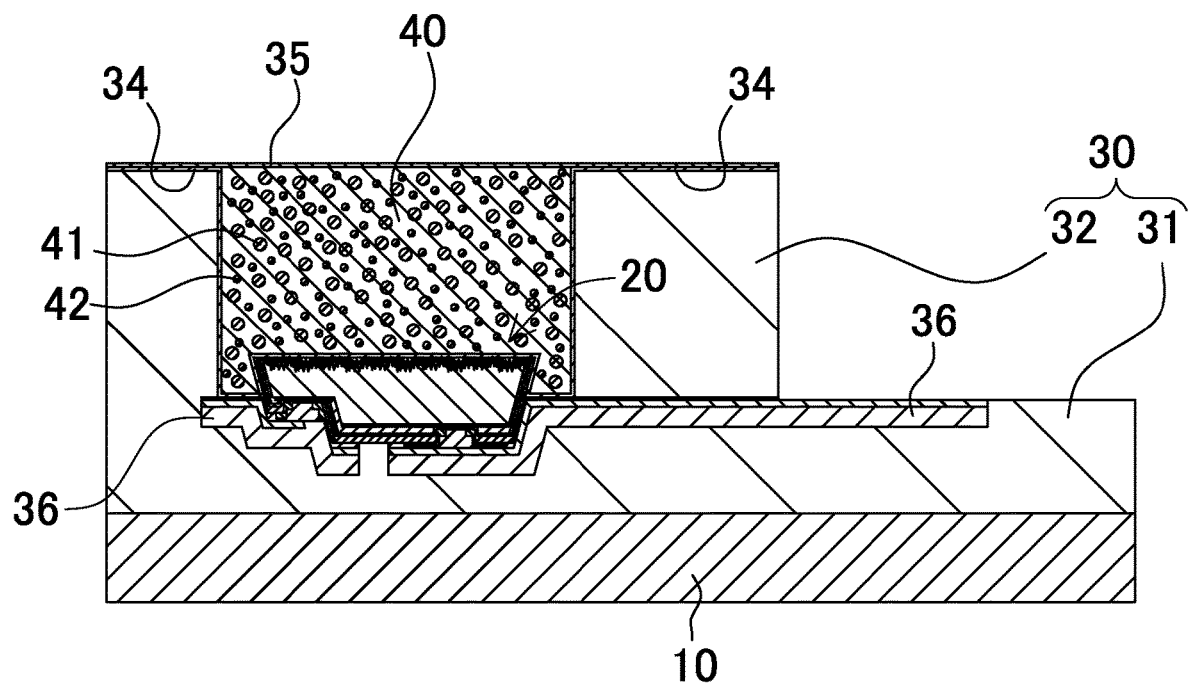
FIG. 9 is a cross-sectional view illustrating an exemplary manufacturing process of the light-emitting device according to the embodiment of the present disclosure.

Thereafter, the second barrier layer 35 is provided. Here, as illustrated in FIG. 9, a layer comprising or composed of Al$_2$O$_3$, SiO$_2$, SiN or the like, or a combination thereof is formed through sputtering such that the layer has an average film thickness of 150 nm.

Finally, the color filter 50 is formed on the second barrier layer 35. Here, as the color filter 50, a pigment-based color resist is applied over the recess 33 of the light reflective member 30 and its nearby top surface of the light reflective member 30. In this manner, the light-emitting device 100 illustrated in FIG. 1 is obtained.

In addition, the color filter is not limited to the plate-shape, and may be formed in a lens shape. The lens-shaped color filter can be formed by patterning a negative-type photoresist material in which pigment is dispersed and the like into a lens shape through photolithography.

FIRST MODIFICATION

Further, the examples of FIG. 1 and the like illustrate the light-emitting device 100 that uses a blue light-emitting diode as the light-emitting element 20, combines the first quantum dot 41 as the red quantum dot for receiving the blue light of this light-emitting element 20 and converting the received blue light into red light and the second quantum dot 42 as the green quantum dot for receiving the blue light and converting the received blue light into green light, and emits white light by mixing the blue light of the light-emitting element 20, the red light of the first quantum dot 41 and the green light the second quantum dot 42. Note that the present disclosureis also applicable to a light-emitting device using other combinations. For example, as illustrated in the cross-sectional view of FIG. 10 as a first modification, the following three blue light-emitting diodes are prepared as the light-emitting element 20: a first light-emitting element 20a, a second light-emitting element 20b, and a third light-emitting element 20c. Blue light-emitting diodes of the same type may be used for the first light-emitting element 20a, the second light-emitting element 20b, and the third light-emitting element 20c. Then, a first light emission region 81 is configured in which the first quantum dot 41a, which is the red quantum dot that receives the blue light and converts the received blue light into red light, is disposed around the first light-emitting element 20a. On the other hand, a second light emission region 82 is configured in which the second quantum dot 42b, which is the green quantum dot that receives the blue light and converts the received blue light into green light, is disposed around the second light-emitting element 20b. The first barrier layer 34 and the second barrier layer 35 are provided to the first light emission region 81 and the second light emission region 82. Meanwhile, the third light-emitting element 20c is disposed as a third light emission region 83. In the third light emission region 83, the quantum dot is not provided, and therefore the first barrier layer 34 and the second barrier layer 35 need not be provided. The light-emitting device 100B configured in this manner can emit white light by mixing the red light of the first light emission region 81, the green light of the second light emission region 82 and the blue light of the third light emission region 83.

Figure 11:
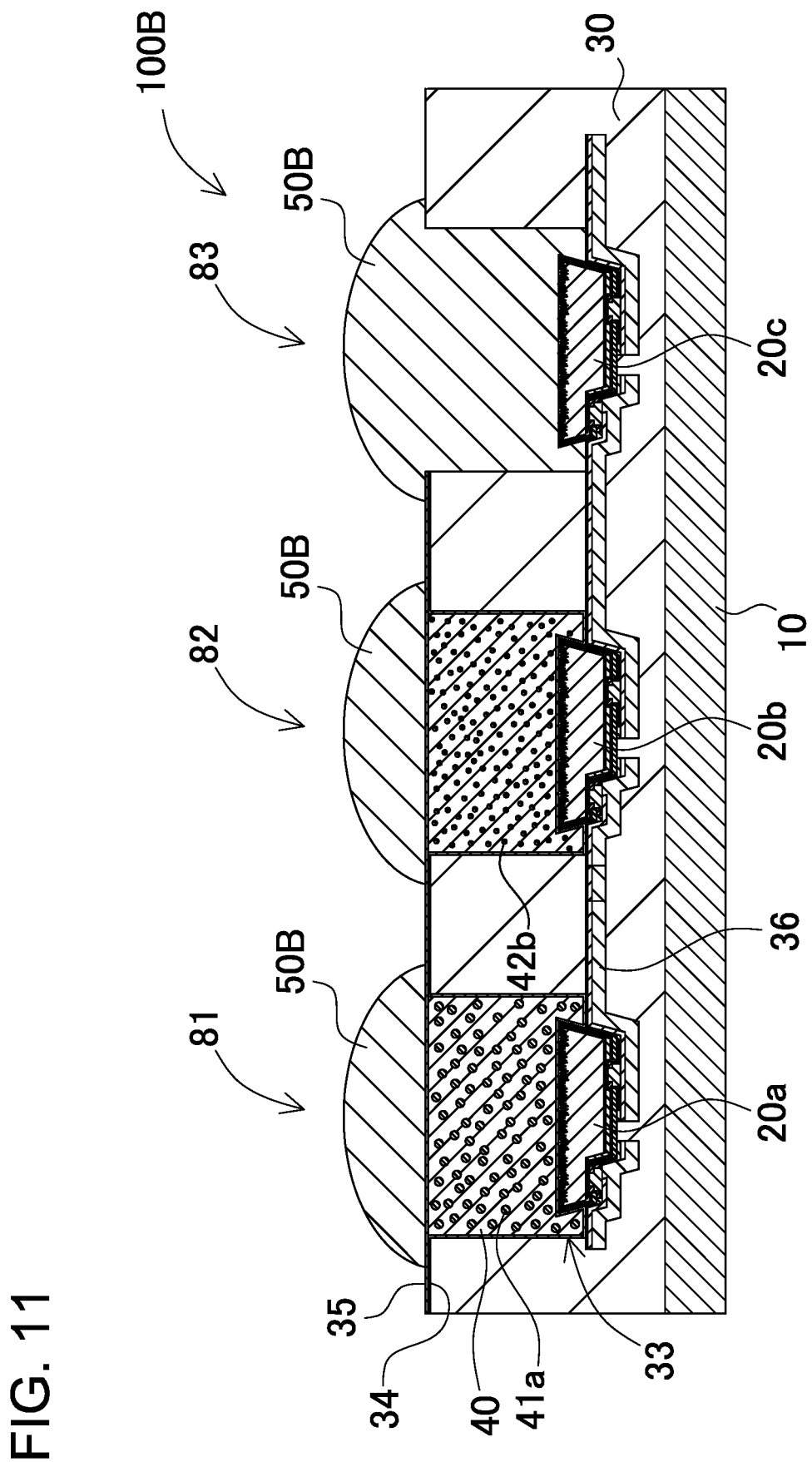
FIG. 11 is a cross-sectional view illustrating an example in which a color filter is provided in the light-emitting device of FIG. 10.

In addition, a color filter may be provided also in the light-emitting device including a plurality of such light emission regions. Such an example is illustrated in the cross-sectional view of FIG. 11. As illustrated in this drawing, the color filter 50B comprising or composed of a negative-type photoresist material in which pigments are dispersed and the like can be applied on the top surface of each light emission region, and the individual color filter 50B can be formed into a lens shape through photolithography.

SECOND MODIFICATION

Further, the light-emitting device may include a black matrix. The black matrix is a light blocking member for improving parting by covering the periphery of the light emission region with black. The black matrix may comprise or be composed of a resin material that contains black pigment or the like serving as a light shielding material so as to have a light-shielding property, or the like. In addition, the black matrix is not limited to the resin, and may comprise or be composed of metal.

Figure 10:
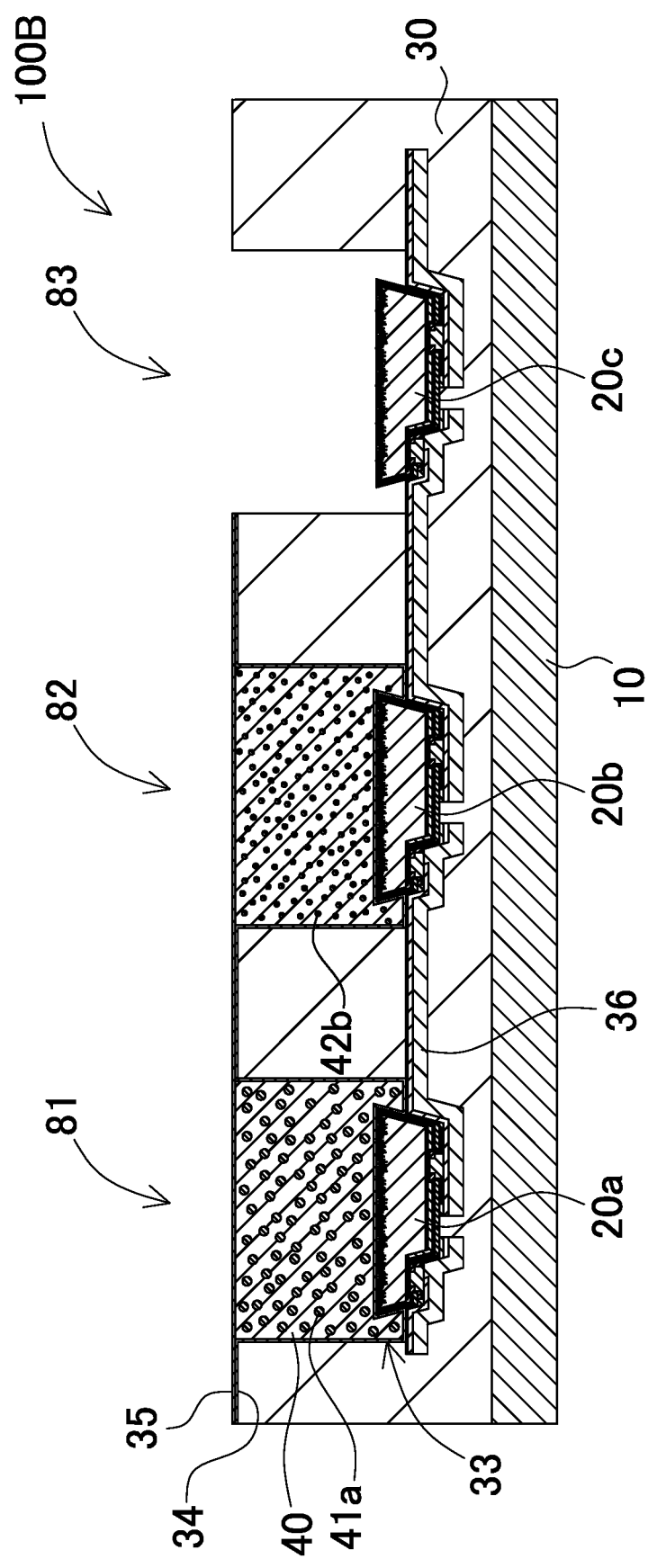
FIG. 10 is a cross-sectional view illustrating an exemplary light-emitting device according to a first modification.
Figure 12:
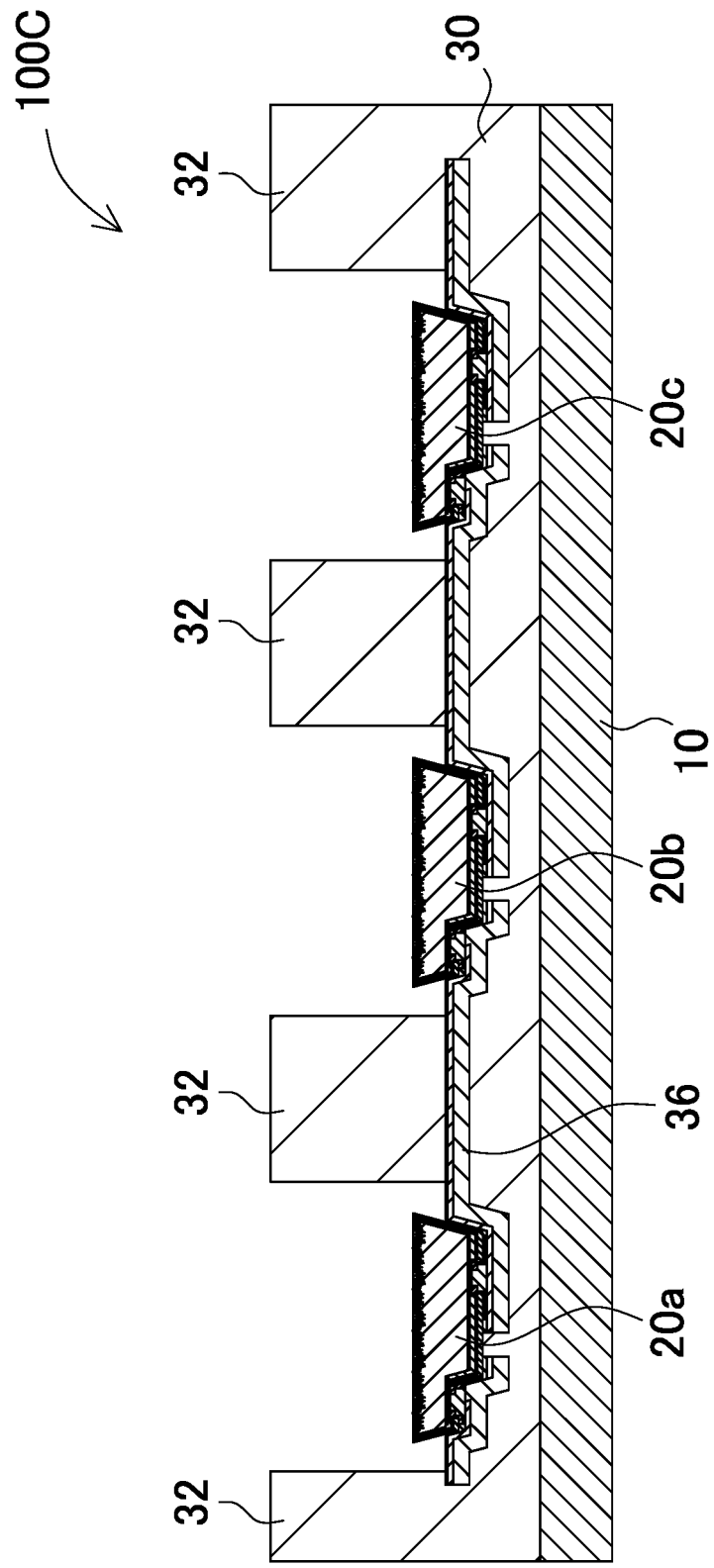
FIG. 12 is a cross-sectional view illustrating an exemplary manufacturing process of a light-emitting device according to a second modification.
Figure 13:
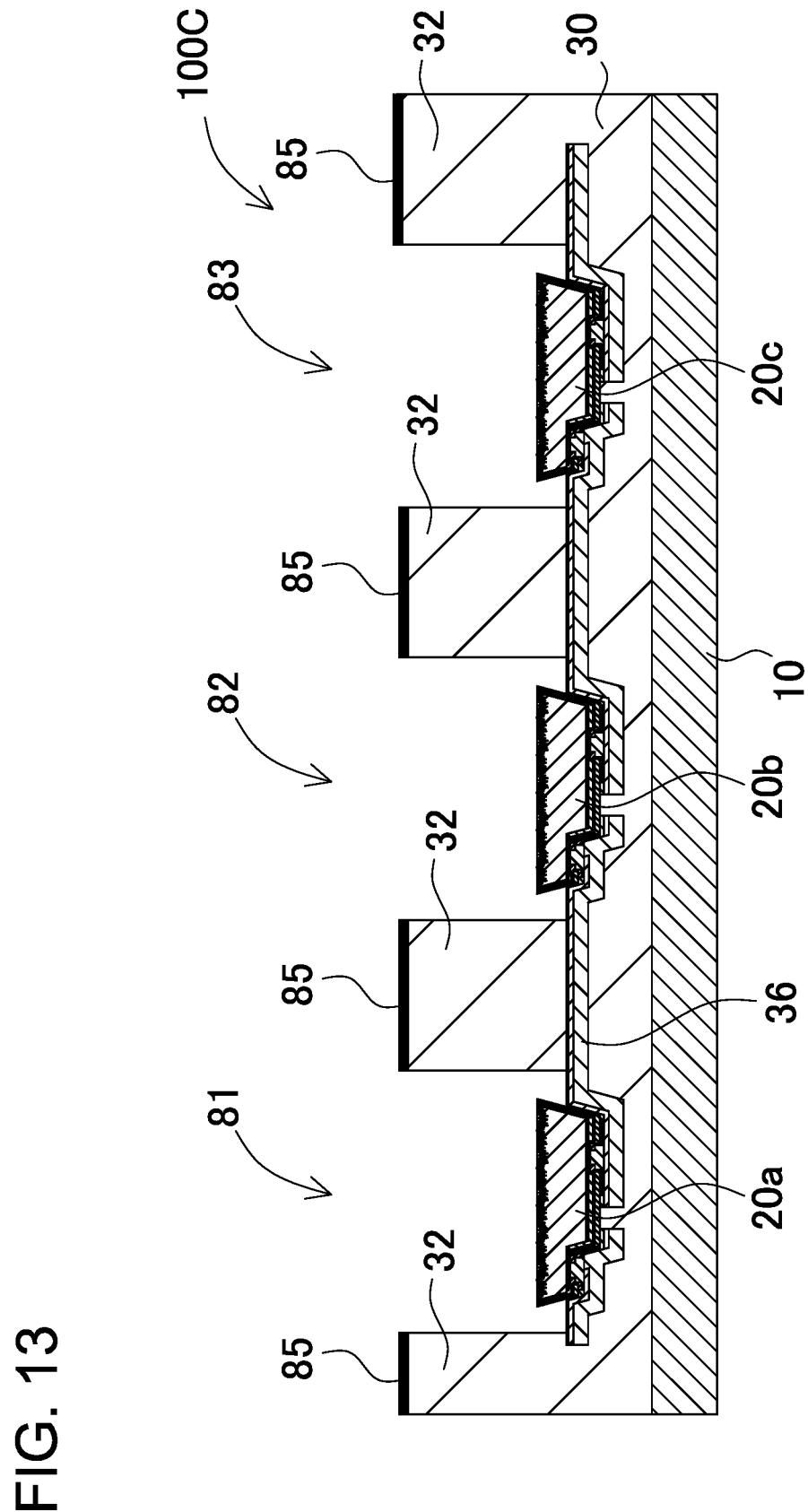
FIG. 13 is a cross-sectional view illustrating an exemplary manufacturing process of the light-emitting device according to the second modification.
Figure 14:
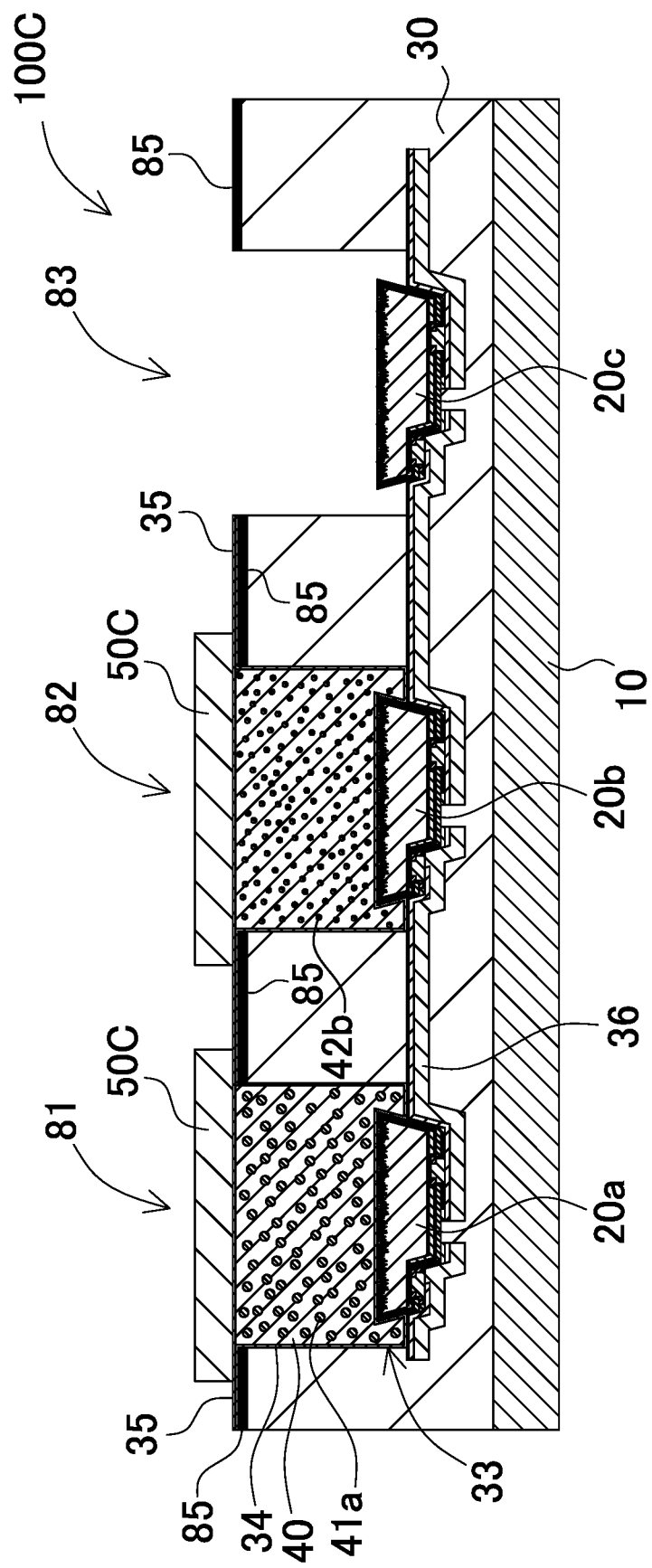
FIG. 14 is a cross-sectional view illustrating an exemplary manufacturing process of the light-emitting device according to the second modification.

As an example of the method for manufacturing the light-emitting device including the black matrix, a procedure of forming a light-emitting device according to Modification 2 obtained by adding a black mask to the light-emitting device of FIG. 10 is described below with reference to FIGS. 12 to 14. First, as illustrated in FIG. 12, the first light emission region 81 in which the first light-emitting element 20a is disposed, the second light emission region 82 in which the second light-emitting element 20b is disposed, and the third light emission region 83 in which the third light-emitting element 20c is disposed are formed. Here, the same procedure as that of the above-described procedure of FIG. 6 can be used for forming the side wall member 32 on the light reflective member 30.

Subsequently, the black matrix 85 is formed on the top surface of each side wall member 32 of FIG. 12. Here, a negative-type photoresist material in which black pigment is dispersed and the like as the light-shielding resin making up the black matrix 85 is applied by a method such as photolithography. The black matrix 85 is provided with a thickness of 1 μm to 10 μm.

In this state, through the same procedure as the procedure described above with reference to FIGS. 7 to 9, the first barrier layer 34 and the second barrier layer 35 are formed to the first light emission region 81 and the second light emission region 82. Further, a color filter is formed on each light emission region as necessary. In the example illustrated in FIG. 14, a plate-shaped color filter 50C is formed on each of the first light emission region 81 and the second light emission region 82. In this manner, the light-emitting device 100C provided with the black matrix 85 can be obtained.

THIRD AND FOURTH MODIFICATIONS

Figure 15:
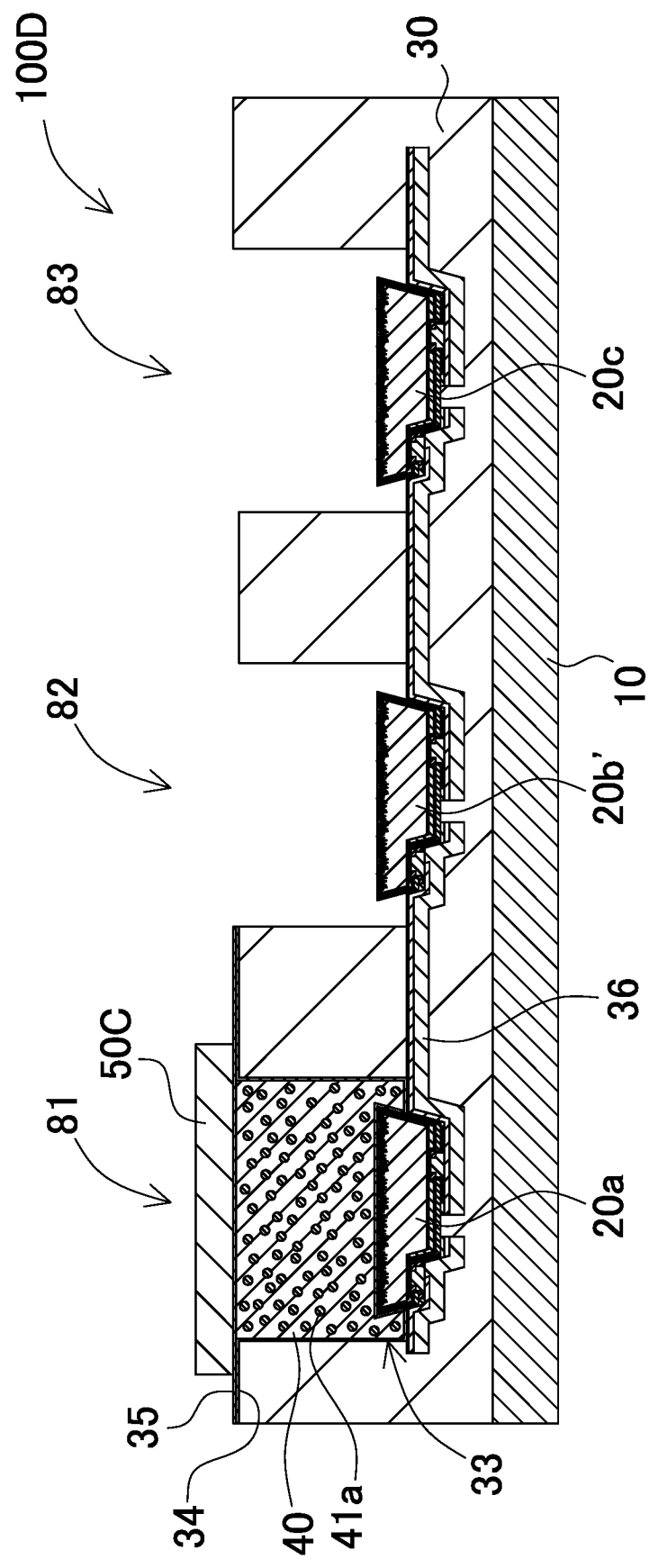
FIG. 15 is a cross-sectional view illustrating an exemplary light-emitting device according to a third modification.
Figure 16:
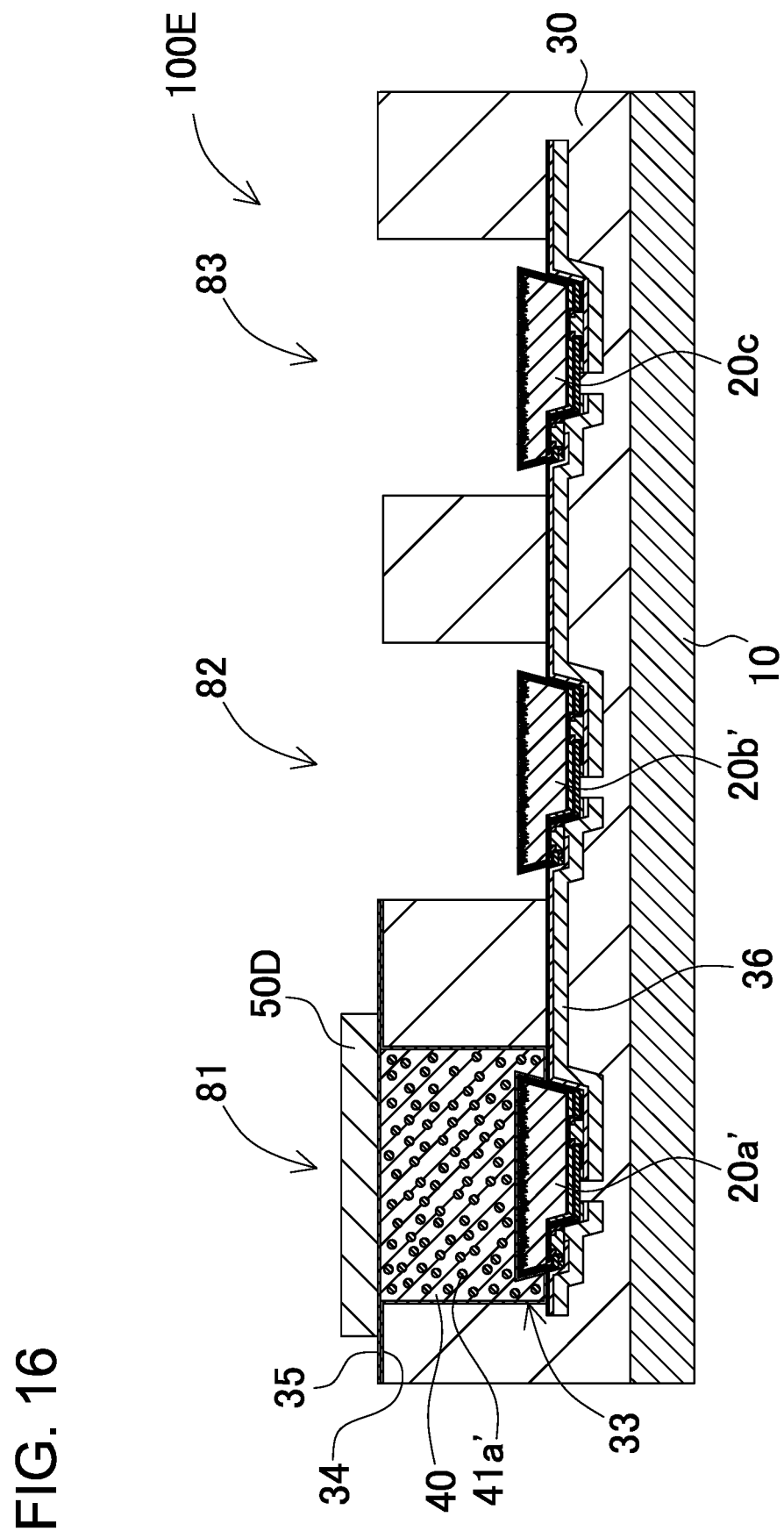
FIG. 16 is a cross-sectional view illustrating an exemplary light-emitting device according to a fourth modification.

In the above-described first and second modifications, an example of a light-emitting device in which only the blue light-emitting diode is used as the light-emitting element, and white light is obtained by mixing the red light of the first light emission region 81, the green light of the second light emission region 82 and the blue light of the third light emission region 83. Note that in the present disclosure, the light-emitting device is not limited to the configuration using the light-emitting element of one type, and the light-emitting device may be configured with a plurality of light-emitting elements that emit light of different colors. For example, as in FIG. 15 illustrating a light-emitting device 100D according to a third modification, in the second light emission region 82, a second light-emitting element 20b' that emits green light may be disposed instead of the configuration used in FIG. 10 and the like in which a green quantum dot that receives the blue light and converts the received blue light into green light is disposed. Alternatively, as in FIG. 16 illustrating a light-emitting device 100E according to a fourth modification, in the first light emission region 81, the first light emission region 81 may be configured in which a first light-emitting element 20a' that emits green light and a first quantum dot 41a' that is the red quantum dot that receives the green light and converts the received green light into red light are disposed, instead of the configuration used in FIG. 15 and the like in which the first light-emitting element 20a that is a blue light-emitting diode and the red quantum dot that receives the blue light and converts the received blue light into red light are disposed. For the first light-emitting element 20a', a green light-emitting diode of the same type as the second light-emitting element 20b' disposed in the second light emission region 82 may be used. Further, a color filter 50D may be added to the first light emission region 81. Each of the light-emitting device 100D according to the third modification and the light-emitting device 100E according to the fourth modification can emit white light by mixing the red light of the first light emission region 81, the green light of the second light emission region 82 and the blue light of the third light emission region 83.

In the above-described examples, the method of forming the side wall member 32 using the resist is described. Note that the present disclosure is not limited to the above-mentioned method of manufacturing the light-emitting device, and other methods may be appropriately used. For example, the side wall member may be formed by using a white dry film as described above. Here, an example in which the side wall member is formed by using a white dry film is described with reference to FIGS. 17 to 18.

First, the base 10 and the light-emitting element 20 are prepared. Subsequently, the primary member 31 of the light reflective member 30 is formed on the top surface of the base 10. Further, the metal layer 36 is formed on a part of the primary member 31, and the light-emitting element 20 is mounted on this metal layer 36. Up to this point, the same procedure as that of the above-described method can be used.

Figure 17:
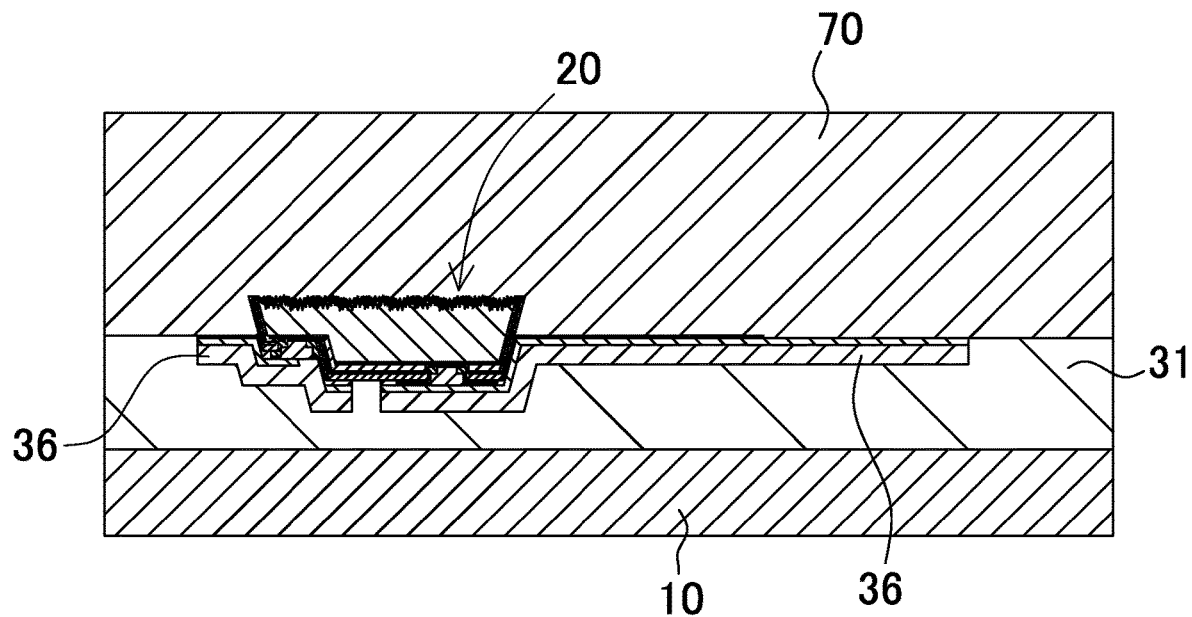
FIG. 17 is a cross-sectional view illustrating an exemplary manufacturing process of an exemplary light-emitting device according to another embodiment of the present disclosure.
Figure 18:
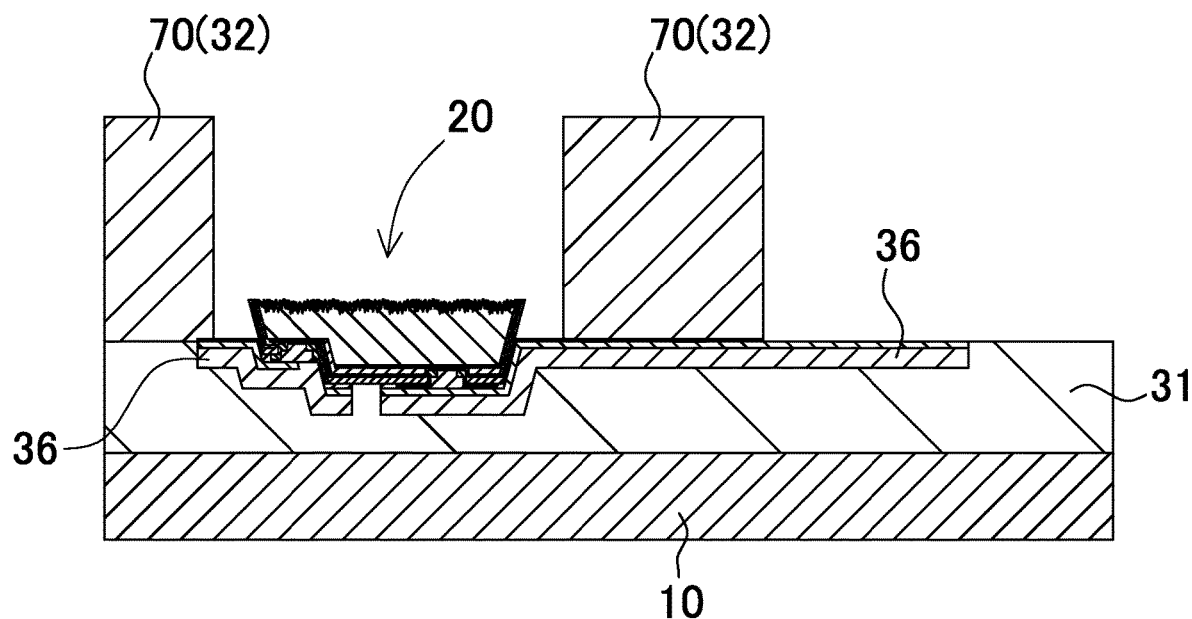
FIG. 18 is a cross-sectional view illustrating an exemplary manufacturing process of the exemplary light-emitting device according to the other embodiment of the present disclosure.

Subsequently, as illustrated in FIG. 17, a white dry film 70 is bonded to the entire top surface of the primary member 31. For the white dry film 70, a negative-type photoresist material such as acrylate resin containing a light reflective material such as titanium oxide, and the like may be used. In this state, development is performed by performing photolithography, and thus unnecessary portions in the white dry film 70 are removed. Here, as illustrated in FIG. 18, the region in which the side wall member 32 will not be formed is removed, and thus the white dry film 70 that has not been removed becomes the side wall member 32. Thereafter, through the same procedure as the procedure described above with reference to FIGS. 7 to 9, the first barrier layer 34, the second barrier layer 35 and the like are provided. In this manner, the light-emitting device 100 illustrated in FIG. 1 is obtained.

EXAMPLES

Figure 19:
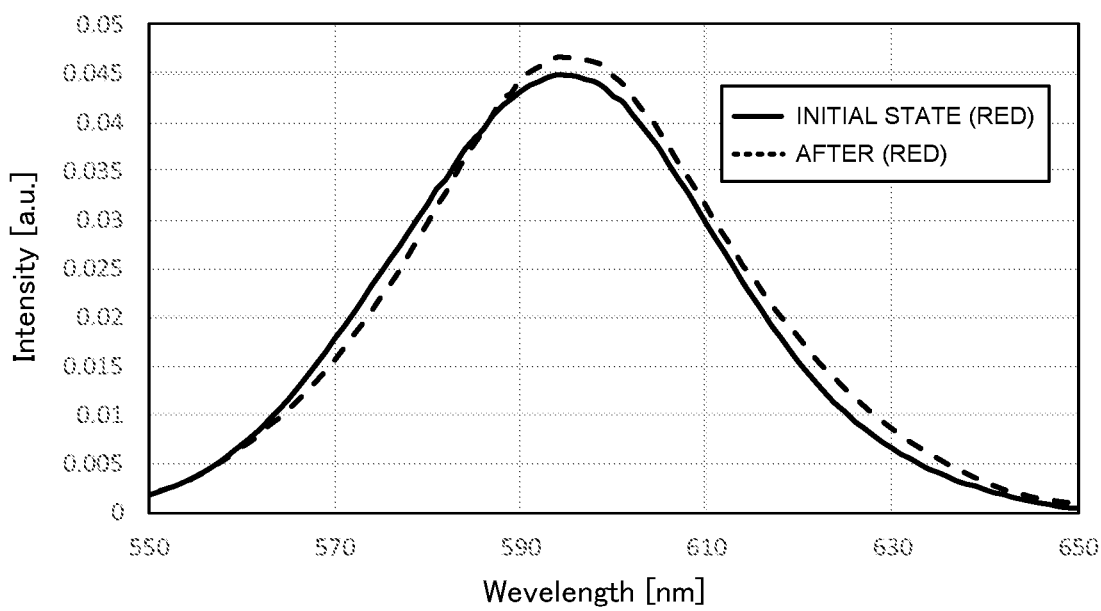
FIG. 19 is a graph illustrating a spectral radiation luminance of a red quantum dot of an exemplary light-emitting device according to the present disclosure.
Figure 20:
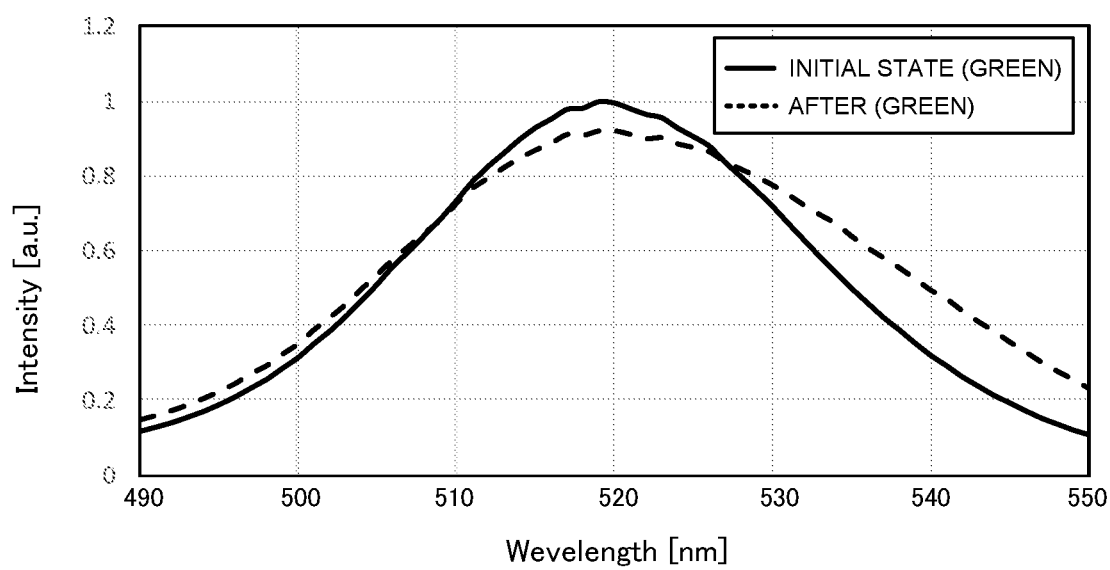
FIG. 20 is a graph illustrating a spectral radiation luminance of a green quantum dot of the exemplary light-emitting device according to the present disclosure.
Figure 21:
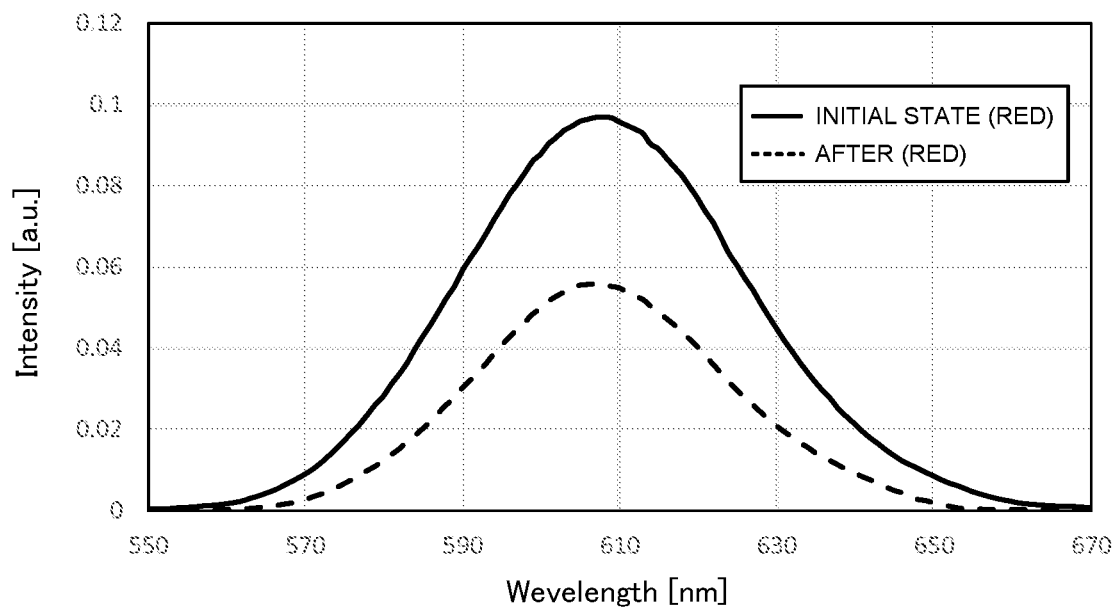
FIG. 21 is a graph illustrating a spectral radiation luminance of a red quantum dot of a light-emitting device according to a comparative example.
Figure 22:
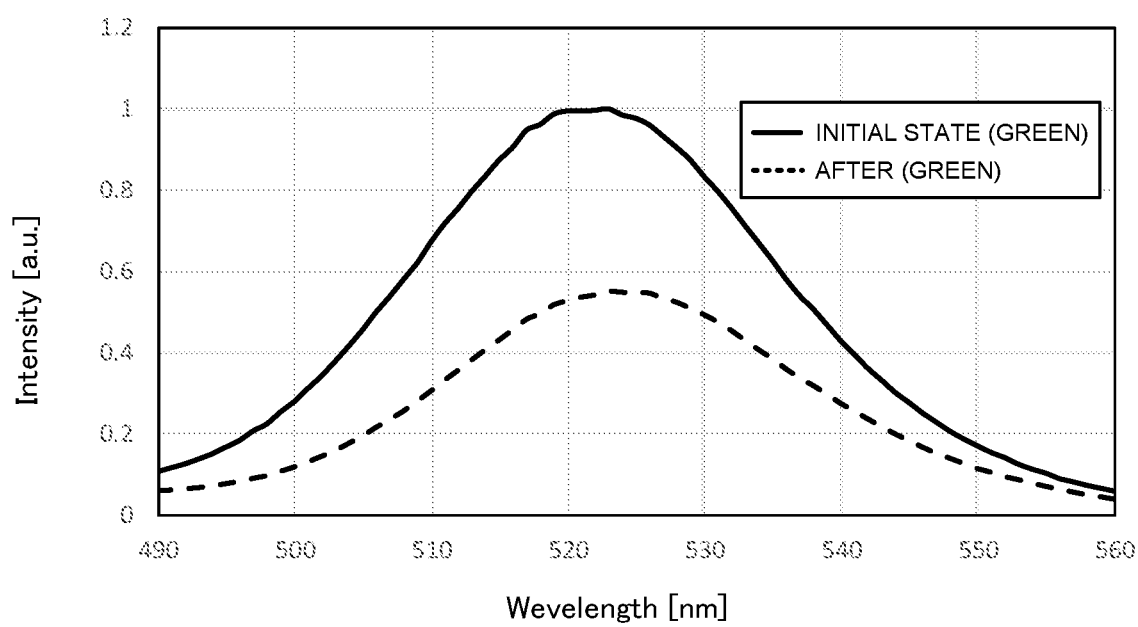
FIG. 22 is a graph illustrating a spectral radiation luminance of a green quantum dot of the light-emitting device according to the comparative example.

The light-emitting device including the first barrier layer and the second barrier layer that is obtained in the above-mentioned manner was produced as a device according to an example, and a light-emitting device that includes neither a first barrier layer nor a second barrier layer was produced as a device according to a comparative example, and their characteristics were compared with each other. Here, the light-emitting devices according to the example and the comparative example were left in an environment of normal temperature (approximately 20° C.) for 10 days (240 hours) immediately after the production, and then their spectral radiation luminance of red quantum dots and spectral radiation luminance of green quantum dots were measured with an XYZ filter method by using 2D-spectroradiometer SR-5100HM available from with Topcon Technohouse Corporation. The measurement results are illustrated in the graphs of FIGS. 19 to 22. In these drawings, FIGS. 19 and 20 illustrate measurement results of the light-emitting device according to the example, and FIGS. 21 and 22 illustrate measurement results of the light-emitting device according to the comparative example. In addition, FIGS. 19 and 21 illustrate the spectral radiation luminance of the red quantum dots, and FIGS. 20 and 22 illustrate the spectral radiation luminance of the green quantum dots. Further, in each drawing, the waveform of an initial state immediately after the production of the light-emitting device is illustrated with solid line, and the waveform of a state after 10 days has passed is illustrated with broken line. As illustrated in the drawings, it was confirmed that the spectral radiation luminance of each of the red quantum dot and green quantum dot significantly decreased in the comparative example, while in the example, substantially the same spectral radiation luminance was maintained and the effect of suppressing the degradation of the quantum dots with the first barrier layer and the second barrier layer was achieved.

APPLICATION EXAMPLES

Figure 23:
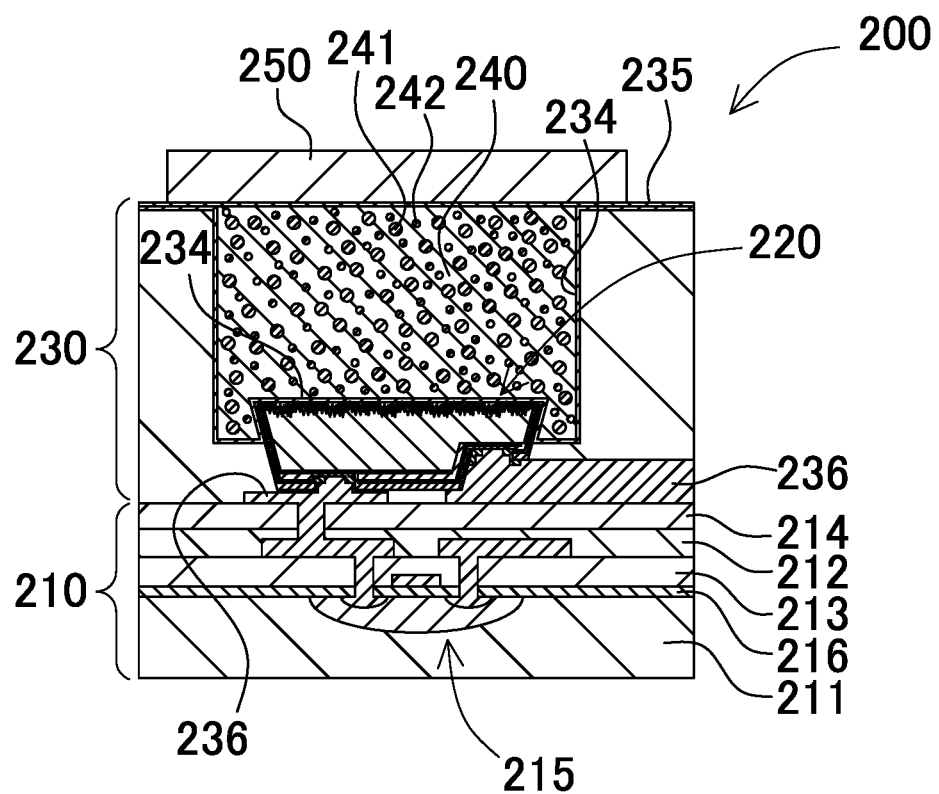
FIG. 23 is an enlarged cross-sectional view of a main part of an exemplary image display device serving as an active matrix display.

The structure disclosed in the present disclosure is applicable to passive matrix array and active matrix array displays for image display. As an example of such light-emitting devices, the enlarged cross-sectional view of FIG. 23 illustrates a main part of an image display device serving as an active matrix display. An image display device 200 illustrated the drawing includes a base 210, a light-emitting element 220 disposed on the base 210, a light reflective member 230 surrounding the light-emitting element 220, a wavelength conversion member 240, and a color filter 250. The surface of the light-emitting element 220 and the inner surface and top surface of the light reflective member 230 are continuously covered with a first barrier layer 234. In addition, the top surface of the wavelength conversion member 240 and a region of the first barrier layer 234 provided on the top surface of the light reflective member 230 are continuously covered with a second barrier layer 235. Further, in the wavelength conversion member 240, a first quantum dot 241 and a second quantum dot 242 are mixed.

Here, in each pixel illustrated in FIG. 23, the first quantum dot 241 and the second quantum dot 242 are mixed, and thus white light obtained by mixing the blue light emission of the light-emitting element 220, the red wavelength conversion output light of the first quantum dot 241, and the green wavelength conversion output light of the second quantum dot 242 is generated. Alternatively, blue, red, green sub-pixels may be provided as described later by optionally providing a blue light-transmissive color filter, a red light-transmissive color filter, and a green light-transmissive color filter. Note that as described above, by further providing a so-called black matrix between the color filters 50, the external light visibility can be improved by suppressing external light reflection.

The base 210 includes a circuit board 211, an intermediate layer 212, an interlayer insulating film 213, a planarizing film 214, and a gate insulating film 216. The circuit board 211 is an Si circuit board using Si. A transistor 215 is provided in a part of the Si circuit board. In addition, the transistor 215 is electrically connected with a metal layer 236 via a through hole and/or a through electrode. On the other hand, the interlayer insulating film 213 is interposed for the purpose of electrical insulation at the intermediate layer 212. Note that for the circuit board 211, glass or resin substrate provided with a low-temperature polycrystal Si transistor or the like may be used instead of the Si circuit board provided with the transistor 215.

Figure 24:
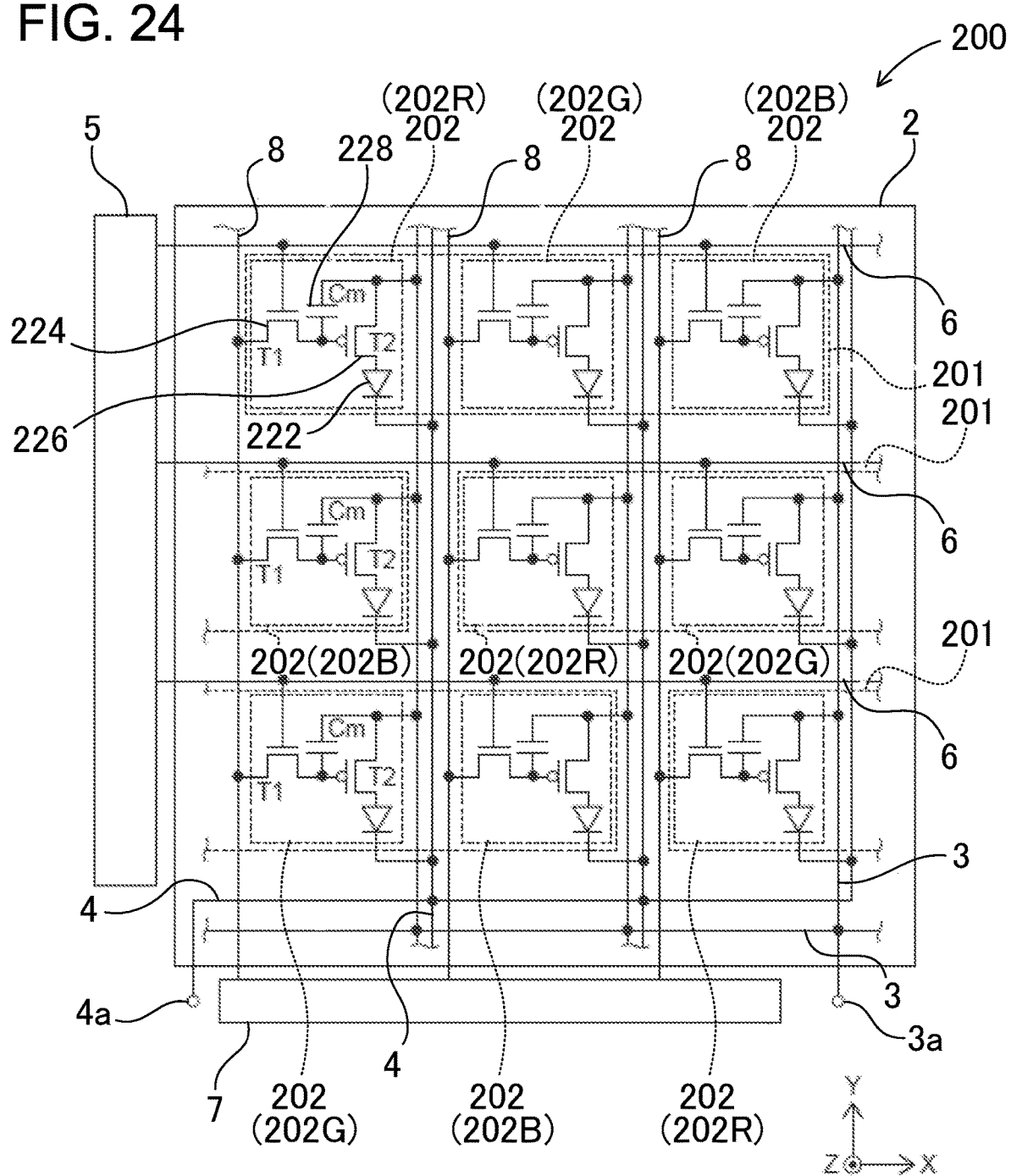
FIG. 24 is a schematic block diagram of an exemplary image display device.

FIG. 24 is a schematic block diagram illustrating the image display device 200. The image display device 200 illustrated in this drawing includes a display region 2. Sub-pixels 202 are arranged in the display region 2. The sub-pixels 202 are arranged in a matrix. For example, n sub-pixels 202 are arranged along the X axis, and m sub-pixels 202 are arranged along the Y axis.

A pixel 201 includes a plurality of the sub-pixels 202 that emit light of different colors. A sub-pixel 202R emits red light. A sub-pixel 202G emits green light. A sub-pixel 202B emits blue light. With the sub-pixels 202R, 202G and 202B of the three types that emit light at the desired luminance, the emission color and luminance of one pixel 201 are set.

One pixel 201 includes three sub-pixels, 202R, 202G and 202B, and the sub-pixels 202R, 202G and 202B are linearly arranged on the X axis as illustrated in FIG. 24, for example. In each pixel 201, sub-pixels of the same color may be arranged on the same line, or sub-pixels of different colors may be arranged on respective lines as in this example.

The image display device 200 further includes a power source line 3 and a ground line 4. The power source line 3 and the ground line 4 are arranged in a matrix along the arrangement of the sub-pixels 202. The power source line 3 and the ground line 4 are electrically connected with each sub-pixel 202, and supply power to each sub-pixel 202 from the direct current power source connected between a power source terminal 3a and a GND terminal 4a. The power source terminal 3a is provided at an end portion of the power source line 3 and the GND terminal 4a is provided at an end portion of the ground line 4, and the power source terminal 3a and the GND terminal 4a are connected with the direct current power supply circuit provided outside the display region 2. The power source terminal 3a is supplied with a positive voltage with respect to the GND terminal 4a.

The image display device 200 further includes a scan line 6 and a signal line 8. The scan line 6 is arranged in a direction parallel to the X axis. That is, the scan line 6 is arranged along the arrangement of the sub-pixels 202 in the row direction. The signal line 8 is arranged in a direction parallel to the Y axis. That is, the signal line 8 is arranged along the arrangement of the sub-pixels 202 in the column direction.

The image display device 200 further includes a row selection circuit 5 and a signal voltage output circuit 7. The row selection circuit 5 and the signal voltage output circuit 7 are provided along the outer edge of the display region 2. The row selection circuit 5 is provided along the outer edge of the display region 2 in the Y-axis direction. The row selection circuit 5 is electrically connected with the sub-pixel 202 of each column through the scan line 6, and supplies a selection signal to each sub-pixel 202.

The signal voltage output circuit 7 is provided along the outer edge of the display region 2 in the X-axis direction. The signal voltage output circuit 7 is electrically connected with the sub-pixel 202 of each row through the signal line 8, and supplies a signal voltage to each sub-pixel 202.

The sub-pixels 202 includes the light-emitting element 220, a selection transistor 224, a driving transistor 226, and a capacitor 228. In FIG. 24, the selection transistor 224 may be represented by T1, the driving transistor 226 may be represented by T2, and the capacitor 228 may be represented by Cm.

The light-emitting element 220 is connected in series with the driving transistor 226. In the present embodiment, the driving transistor 226 is a p-channel TFT, and the anode electrode of the light-emitting element 220 is connected with the drain electrode of the driving transistor 226. The main electrodes of the driving transistor 226 and the selection transistor 224 are the drain electrode and the source electrode. The anode electrode of the light-emitting element 220 is connected with the p-semiconductor layer of the semiconductor laminate. The cathode electrode of the light-emitting element 220 is connected with the n-semiconductor layer of the semiconductor laminate. The series circuit of the light-emitting element 220 and the driving transistor 226 is connected between the power source line 3 and the ground line 4. The driving transistor 226 corresponds to the transistor 215 in FIG. 23, and the light-emitting element 220 corresponds to a light-emitting element 222 in FIG. 24. The current flowing through the light-emitting element 222 is determined by the voltage applied between the gate and source of the driving transistor 226, and the light-emitting element 222 emits light at the luminance corresponding to the flowing current.

The selection transistor 224 is connected between the gate electrode of the driving transistor 226 and the signal line 8 through the main electrode. The gate electrode of the selection transistor 224 is connected with the scan line 6. The capacitor 228 is connected between the gate electrode of the driving transistor 226 and the power source line 3.

The row selection circuit 5 selects one row from the arrangement of the sub-pixels 202 of m rows, and supplies a selection signal to the scan line 6. The signal voltage output circuit 7 supplies a signal voltage with a required analog voltage value to each sub-pixel 202 of the selected row. A signal voltage is applied between the gate and source of the driving transistor 226 of the sub-pixel 202 of the selected row. The signal voltage is held by the capacitor 228. The driving transistor 226 supplies a current corresponding to the signal voltage through the light-emitting element 220. The light-emitting element 220 emits light at the luminance corresponding to the flowing current.

The row selection circuit 5 sequentially switches the row to be selected and supplies the selection signal. That is, the row selection circuit 5 scans the row in which the sub-pixels 202 are arranged. The current corresponding to the signal voltage flows through the light-emitting element 220 of the sequentially scanned sub-pixels 202, and thus light is emitted. The luminance of the sub-pixels 202 is determined by the current flowing through the light-emitting element 220. The sub-pixel 202 emits light with the gradation based on the determined luminance, and an image is displayed in the display region 2.

Note that while a low-cost structure that can collectively form the wavelength conversion members 240 by providing the same wavelength conversion member 240 in each sub-pixel to generate white light is described above in the application example, the wavelength conversion member 240 may have a different structure for each of blue, red, and green sub-pixels. In this case, the blue sub-pixel is not provided with the wavelength conversion function, the red sub-pixel is provided with the red wavelength conversion function, and the green sub-pixel is provided with the green wavelength conversion function. In such a case, blue light can be efficiently emitted to the outside, and thus the power consumption at the time of light emission can be reduced.

MODIFICATION

Figure 25:
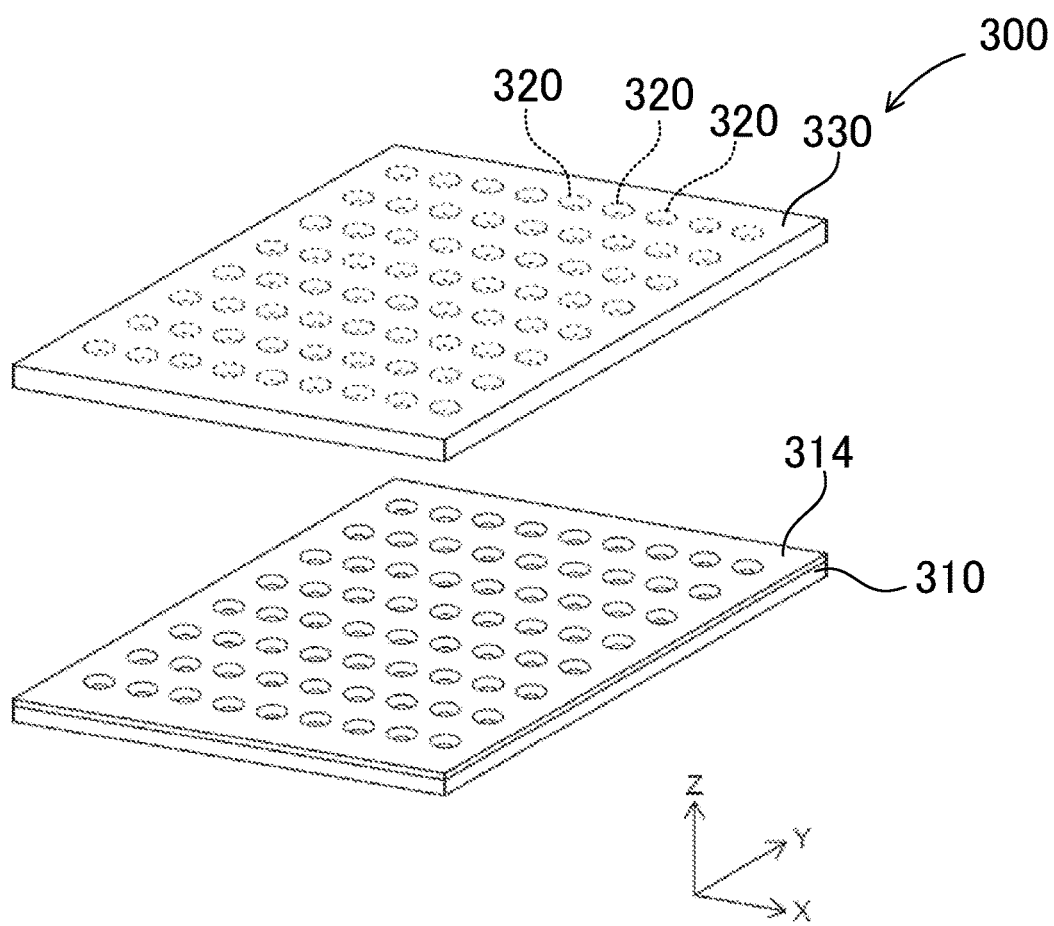
FIG. 25 is a schematic perspective view illustrating an exemplary image display device according to a modification.

In addition, the image display device may be configured by stacking separate plate members and/or laminar members. Example of such a configuration is illustrated in FIG. 25. In an image display device 300 illustrated in this drawing, a plate-shaped or laminar shaped side wall member 330 including a large number of light-emitting elements 320 is overlaid on the primary member 314, which is also a planarizing film of a circuit layer 310. A plurality of recesses are provided in the side wall member 330, and the light-emitting element 320 is embedded in each recess. In the recess, a wavelength conversion member sealed with a first barrier layer and a second barrier layer is also provided. In addition, a color filter is provided at the position corresponding to each recess on the side wall member 330. A depression is formed at a position corresponding to each light-emitting element 320 in the circuit layer 310 and the primary member 314, and a connecting terminal corresponding to each light-emitting element 320 is provided inside the depression.

With the configuration obtained by stacking the circuit layer 310 and the side wall member 330, the image display device 300 can handle the circuit layer 310 and the side wall member 330 including a large number of light-emitting elements 320 and the wavelength conversion member, as separate members. This can improve yield and reduce costs. The reason for this is that the circuit layer 310 and the side wall member 330 can be stacked after the circuit layer 310 and the side wall member 330 are separately subjected to defect inspection and defectives are removed and repaired.

It should be apparent to those with an ordinary skill in the art that while various preferred examples of the invention have been shown and described, it is contemplated that the invention is not limited to the particular examples disclosed. Rather, the disclosed examples are merely illustrative of the inventive concepts and should not be interpreted as limiting the scope of the invention. All suitable modifications and changes falling within the spirit of the invention are intended to be encompassed by the appended claims.

INDUSTRIAL APPLICABILITY

The light-emitting device and the method for manufacturing the light-emitting device of the present invention suitable for large displays, medium-sized monitors for smartphones, tablets and in-vehicle use, or small screens such as HMDs and smart glass screens, for example.

What is claimed is:

1. A method for manufacturing a light-emitting device including a light-emitting element and a quantum dot configured to convert light emitted by the light-emitting element, the method comprising:
   preparing a base and a light-emitting element having a surface and disposed on the base;
      forming a light reflective member having an inner surface and a top surface and surrounding the light-emitting element;
      forming a first barrier layer continuously covering the surface of the light-emitting element and the inner surface of the light reflective member and the top surface of the light reflective member;
      forming a wavelength conversion member having a top surface and including the quantum dot in a region surrounded by the inner surface of the light reflective member, the light-emitting element being embedded in the wavelength conversion member; and
      covering, with a second barrier layer, the top surface of the wavelength conversion member and at least a portion of the first barrier layer on the top surface of the light reflective member.

2. The method according to claim 1, further comprising providing a color filter on the second barrier layer.

3. The method according to claim 1, wherein the first barrier layer and the second barrier layer comprise or are composed of the same material.

4. The method according to claim 1, wherein a thickness of the first barrier layer is the same as or greater than a thickness of the second barrier layer.

5. The method according to claim 1, wherein the top surface of the wavelength conversion member and the top surface of the light reflective member are formed on the same plane.

6. The method according to claim 1, wherein the forming of the wavelength conversion member comprises forming the wavelength conversion member including the quantum dot by photolithography.

7. The method according to claim 1, wherein the forming of the wavelength conversion member comprises jetting a wavelength conversion member material including the quantum dot from an ink-jet nozzle.

8. The method according to claim 1, wherein the forming of the first barrier layer comprises forming of the first barrier layer by sputtering.

9. The method according to claim 1, wherein an average film thickness of the first barrier layer and/or an average film thickness of the second barrier layer is in a range from 100 nm to 200 nm.

10. The method according to claim 1, wherein the first barrier layer and/or the second barrier layer comprises $AlN_a$, $AlO_b$, $SiO_c$ or $SiN_d$ ($\frac{1}{3} \leq a \leq 1$, $0.5 \leq b \leq 1.5$, $0.5 \leq c \leq 2$, $\frac{1}{3} \leq d \leq \frac{4}{3}$), or a combination thereof.

11. The method according to claim 1, wherein an oxygen permeability of the first barrier layer and/or the second barrier layer is $1 \times 10^{-2}$ g/m$^2$/day or less.

12. A light-emitting device comprising:
   a base;
   a light-emitting element having a surface and disposed on the base;
   a light reflective member having an inner surface and a top surface and surrounding the light-emitting element;
   a first barrier layer continuously covering the surface of the light-emitting element and the inner surface of the light reflective member and the top surface of the light reflective member;
   a wavelength conversion member having a top surface and including a quantum dot and disposed in a region surrounded by the inner surface of the light reflective member; and
   a second barrier layer covering the top surface of the wavelength conversion member and at least a portion of the first barrier layer on the top surface of the light reflective member.

13. The light-emitting device according to claim 12, further comprising a color filter provided on the second barrier layer.

14. The light-emitting device according to claim 12, wherein the first barrier layer and the second barrier layer comprise or are composed of the same material.

15. The light-emitting device according to claim 12, wherein a thickness of the first barrier layer is the same as or greater than a thickness of the second barrier layer.

16. The light-emitting device according to claim 12, wherein the top surface of the wavelength conversion member and the top surface of the light reflective member are formed on the same plane.

17. The light-emitting device according to claim 12, wherein an average film thickness of the first barrier layer and/or an average film thickness of the second barrier layer is in a range from 100 nm to 200 nm.

18. The light-emitting device according to claim 12, wherein the first barrier layer and/or the second barrier layer comprises at least one selected from the group consisting of $AlN_a$, $AlO_b$, $SiO_c$ and $SiN_d$ ($1/3 \leq a \leq 1$, $0.5 \leq b \leq 1.5$, $0.5 \leq c \leq 2$, $1/3 \leq d \leq 4/3$), and a combination thereof.

19. The light-emitting device according to claim 12, wherein an oxygen permeability of the first barrier layer and/or the second barrier layer is $1 \times 10^{-2}$ $g/m^2/day$ or less.

* * * * *